(12) United States Patent
Ogawa et al.

(10) Patent No.: US 10,511,233 B2
(45) Date of Patent: Dec. 17, 2019

(54) CURRENT ESTIMATING DEVICE

(71) Applicant: DAIKIN INDUSTRIES, LTD., Osaka-shi, Osaka (JP)

(72) Inventors: Takurou Ogawa, Osaka (JP); Eiji Tooyama, Osaka (JP); Akiko Sera, Osaka (JP); Morimitsu Sekimoto, Osaka (JP)

(73) Assignee: DAIKIN INDUSTRIES, LTD., Osaka-Shi (JP)

( * ) Notice: Subject to any disclaimer, the term of this patent is extended or adjusted under 35 U.S.C. 154(b) by 0 days.

(21) Appl. No.: 16/332,907

(22) PCT Filed: Sep. 28, 2017

(86) PCT No.: PCT/JP2017/035239
§ 371 (c)(1),
(2) Date: Mar. 13, 2019

(87) PCT Pub. No.: WO2018/062395
PCT Pub. Date: Apr. 5, 2018

(65) Prior Publication Data
US 2019/0260304 A1 Aug. 22, 2019

(30) Foreign Application Priority Data
Sep. 30, 2016 (JP) .................... 2016-194824

(51) Int. Cl.
*H02M 5/458* (2006.01)
*H02M 7/217* (2006.01)
(Continued)

(52) U.S. Cl.
CPC .......... *H02M 7/2176* (2013.01); *H02M 1/12* (2013.01); *H02M 7/219* (2013.01); *H02M 7/539* (2013.01);
(Continued)

(58) Field of Classification Search
CPC . H02M 2001/0009; H02M 5/458; H02M 7/06
See application file for complete search history.

(56) References Cited

U.S. PATENT DOCUMENTS

| | | | | |
|---|---|---|---|---|
| 5,731,681 A | * | 3/1998 | Inaniwa | H02M 5/4585 318/376 |
| 2013/0300334 A1 | * | 11/2013 | Tooyama | H02M 1/12 318/504 |
| 2015/0256095 A1 | * | 9/2015 | Ohta | H02M 7/4826 363/37 |

FOREIGN PATENT DOCUMENTS

| | | |
|---|---|---|
| EP | 2667501 A1 | 11/2013 |
| JP | 11-113261 A | 4/1999 |

(Continued)

OTHER PUBLICATIONS

International Search Report, issued in PCT/JP2017/035239, PCT/ISA/210, dated Dec. 19, 2017.
(Continued)

*Primary Examiner* — Harry R Behm
(74) *Attorney, Agent, or Firm* — Birch, Stewart, Kolasch & Birch, LLP

(57) ABSTRACT

The voltage detection circuit (33) is a voltage divider circuit including a plurality of resistances (34a to 34c and 35a to 35c) and detects voltages (Vac1, Vac2) correlating with a power source voltage (Vin) of the AC power source (91). The calculation unit (40) obtains the across voltage (VL) of the reactor (29) using detection results (Vac1, Vac2) of the voltage detection circuit (33), and estimates a power source current (Iin) based on the across voltage (VL). The calculation unit (40) corrects gains of the detection results (Vac1, Vac2) so that a value correlating with an average value per predetermined time period of the estimated power source current (Iin) matches a value correlating with an average value per the predetermined time period of a current (Iinv)

(Continued)

downstream of the capacitor (26), and obtains the across voltage (VL) using the detection results (Vac1, Vac2).

16 Claims, 17 Drawing Sheets

(51) Int. Cl.
*H02M 1/12* (2006.01)
*H02M 7/219* (2006.01)
*H02M 7/539* (2006.01)
*H02M 1/00* (2006.01)

(52) U.S. Cl.
CPC .... *H02M 5/458* (2013.01); *H02M 2001/0009* (2013.01)

(56) References Cited

FOREIGN PATENT DOCUMENTS

| | | |
|---|---|---|
| JP | 2008-43057 A | 2/2008 |
| JP | 2011-205729 A | 10/2011 |
| JP | 2012-151973 A | 8/2012 |
| JP | 2012-165631 A | 8/2012 |

OTHER PUBLICATIONS

Written Opinion of the International Searching Authority, issued in PCT/JP2017/035239, PCT/ISA/237, dated Dec. 19, 2017.

International Preliminary Report on Patentability and English translation of the Written Opinion of the International Searching Authority, dated Apr. 11, 2019, for International Application No. PCT/JP2017/035239.

* cited by examiner

OVERALL FLOW OF PROCESS PERFORMED BY CONTROLLER

* Iin IS USED FOR INVERTER CONTROL

FLOW OF ADJUSTMENT OF GAIN CORRECTION COEFFICIENTS AND OFFSET CORRECTION COEFFICIENT

FIG.17

| CIRCUIT PATTERN | POSITION OF REACTOR | DETECTION POSITION OF VOLTAGE DETECTION CIRCUIT | CORRECTION FOR VOLTAGE DROP (2Vdb) IN DIODE | CORRECTION FOR VOLTAGE DROP (VR) IN REACTOR | ADJUSTMENT OF GAIN CORRECTION COEFFICIENTS (G1, G2) | ADJUSTMENT OF OFFSET CORRECTION COEFFICIENT (offset) |
|---|---|---|---|---|---|---|
| No.1 | AC | AC | ○ | ○ | ○ | ○ |
| No.2 | DC | DC | × | ○ | ○ | × |
| No.3 | DC | AC | ○ | ○ | ○ | × |
| No.4 | AC | AC | ○ | ○ | ○ | ○ |
| No.5 | DC | AC | ○ | ○ | ○ | × |

○: APPLIED
×: Not APPLIED

CURRENT ESTIMATING DEVICE

TECHNICAL FIELD

The present invention relates to, in a power converter in which a capacitor is connected between a rectifying circuit and an inverter circuit in parallel with the rectifying circuit, and a reactor is connected between an AC power source and the capacitor, a current estimating device estimating a power source current for controlling an inverter circuit.

BACKGROUND ART

A power converter has been known which includes a converter circuit for converting AC power of an AC power source into DC power, and an inverter circuit for converting an output of the converter circuit into AC power of a predetermined frequency. In such a power converter, a capacitor is generally provided on an output side of the converter circuit.

As such a power converter, for example, Patent Document 1 is known. In Patent Document 1, inverter control including control of a harmonics of the power source is performed on the basis of the detected power source current. Examples of a method of detecting a power source current include: a method using a current detection sensor called a current transformer (CT) (Patent Document 1); and a method using a current detection circuit including a shunt resistance and an operational amplifier instead of a current detection sensor (Patent Document 2).

However, when a current detection sensor is used, it is necessary to provide a space for arrangement of the sensor, resulting in an increase in cost of the sensor.

In the case of using a current detection circuit, since the number of components of the circuit is larger than that of a voltage divider circuit which is used for detecting a DC voltage and has a simple configuration, resulting in an increase in cost. Furthermore, it is necessary to provide an arrangement space for the components of the current detection circuit on a printed wiring board.

On the other hand, as disclosed in Patent Document 3, there is a method of estimating a power source current without detecting the power source current.

CITATION LIST

Patent Document

Patent Document 1: Japanese Unexamined Patent Publication No. 2012-165631
Patent Document 2: Japanese Unexamined Patent Publication No. 2012-151973
Patent Document 3: Japanese Unexamined Patent Publication No. 2011-205729

SUMMARY OF THE INVENTION

Technical Problem

In Patent Document 3, an across voltage of a reactor located between a converter circuit and an inverter circuit is detected, and a power source current is estimated based on the result of the detection. The across voltage of the reactor is detected by the voltage detection circuit comprising the voltage divider circuit. Therefore, in Patent Document 3, the number of components may be smaller than in Patent Document 1, and the arrangement space of the components does not have to be larger than that in Patent Documents 1 and 2.

However, in Patent Document 3, since the power source current is estimated using the across voltage of the reactor detected by the voltage detection circuit as it is, the estimated power source current might not coincide with an actual power source current. This is because the component of the voltage detection circuit (for example, a resistance) varies due to an individual difference or a temperature characteristic, resulting in an error in the detection result of the voltage detection circuit due to the variation. If the across voltage of the reactor cannot be accurately detected, the estimated power source current is not accurate either, causing an adverse effect on the inverter control using the power source current.

In view of the foregoing, it is an object of the present invention to accurately and inexpensively estimate a power source current using a voltage detection circuit.

Solution to the Problem

According to a first aspect of the present disclosure, a current estimating device (10) included in a power converter (1) and estimating a power source current (Iin) which is a current upstream of a capacitor (26), the power converter (1) including: a rectifying circuit (21) rectifying an AC power output from an AC power source (91); an inverter circuit (27) supplied with power from the rectifying circuit (21); the capacitor (26) connected between the rectifying circuit (21) and the inverter circuit (27) in parallel with the rectifying circuit (21); and a reactor (29) connected between the AC power source (91) and the capacitor (26), the current estimating device (10) comprising: a voltage detection circuit (33) which is a voltage divider circuit including a plurality of resistances (34a to 34c, 35a to 35c), the voltage detection circuit (33) detecting voltages (Vac1, Vac2) correlating with a power source voltage (Vin) of the AC power source (91); and a calculation unit (40) obtaining an across voltage (VL) of the reactor (29) based on detection results (Vac1, Vac2) detected by the voltage detection circuit (33), and estimating the power source current (Iin) based on the across voltage (VL), wherein the calculation unit (40): corrects gains of the detection results (Vac1, Vac2) of the voltage detection circuit (33) so that a value correlating with an average value per predetermined time period of the estimated power source current (Iin) matches a value correlating with an average value per the predetermined time period of a current (Iinv) downstream of the capacitor (26); and obtains the across voltage (VL) of the reactor (29) based on the detection results (Vac1, Vac2), of the voltage detection circuit (33), with the gains corrected.

Here, the voltages (Vac1, Vac2) correlating with the power source voltage (Vin) are detected by the voltage detection circuit (33). However, the detection results (Vac1, Vac2) are not used as they are for estimation of the power source current. The detection results (Vac1, Vac2) receive gain correction, and then are used for estimation of the power source current (Iin). In particular, the gains are corrected so that a value correlating with an average value per predetermined time period of the estimated power source current (Iin) match a value correlating with an average value per predetermined time period of the current (Iinv) downstream of the capacitor (26). Here, examples of "the value correlating with the average value" include an average value itself per predetermined time period of the currents (Iin, Iinv), and an integrated value per predetermined time period of the currents (Iin, Iinv). The fact that the value relating to the estimated power source current (Iin) matches the value related to the current (Iinv) downstream of the capacitor (26) means that a value obtained by calculation and correlating with an average value per predetermined time period of the current (Ic) flowing through the capacitor (26) converges to 0.

In this current estimating device (10), the gains of the detection results (Vac1, Vac2) of the voltage detection circuit (33) are corrected, and, based on the detection results (Vac1, Vac2) with the gains corrected, the power source current (Iin) is estimated. Thus, this current estimating device (10) can accurately calculate the power source current (Iin) using the voltage detection circuit (33) having a relatively simple configuration without using a current sensor or a current detection circuit.

A second aspect is an embodiment of the first aspect. In the second aspect, the capacitor (26) may absorb voltage fluctuation caused by switching of the inverter circuit (27) without absorbing voltage fluctuation from the rectifying circuit (21).

This means that the capacitor (26) has a relatively small capacitance. Since the capacitor (26) having a small capacity does not absorb voltage fluctuations from the rectifying circuit (21), a ripple voltage caused by the power source frequency of the AC power source (91) cannot be smoothed. Hence, a harmonics of the power source is likely to be generated. Therefore, the inverter circuit (27) needs to be controlled to minimize the harmonics of the power source. For such a control, a power source current is used. On the other hand, as described above, the current estimating device (10) can accurately estimate the power source current (Iin) as described above. The use of the estimated power source current (Iin) with high accuracy achieves more accurate control of the inverter circuit (27) reducing the harmonics of the power sources.

A third aspect is an embodiment of the first or second aspect. In the third aspect, the calculation unit (40) may further obtain the across voltage (VL) of the reactor (29) based on a voltage drop (VR) of the reactor (29).

Thus, the across voltage (VL) of the reactor (29) can be obtained with higher accurately.

A fourth aspect is an embodiment of any one of the first to third aspects. In the fourth aspect, the rectifying circuit (21) may be configured as a diode bridge circuit including a plurality of diodes (D1 to D4) connected in a bridge configuration, and the calculation unit (40) may further obtain the across voltage (VL) of the reactor (29) based on a voltage drop (Vdb) generated in the diodes (D1 to D4).

Thus, the across voltage (VL) of the reactor (29) can be obtained with higher accurately.

A fifth aspect is an embodiment of the fourth aspect. In the fifth aspect, the voltage detection circuit (33) may detect voltages (Vac1, Vac2) correlating with a power source voltage (Vin) of the AC power source (91) between the AC power source (91) and the rectifying circuit (21).

A sixth aspect is an embodiment of any one of the first to fifth aspects. In the sixth aspect, the voltage detection circuit (33) may include: a first voltage detection unit (34) corresponding to a positive side output of the AC power source (91); and a second voltage detection unit (35) corresponding to a negative side output of the AC power source (91), and the calculation unit (40) may: correct the gains each for one of the first detection result (Vac1) of the first voltage detection unit (34) and of the second detection result (Vac2) of the second voltage detection unit (35) so that the value correlating with the average value per the predetermined time period of the estimated power source current (Iin) matches the value correlating with the average value per the predetermined time period of the current (Iinv) downstream of the capacitor (26); and obtain the across voltage (VL) of the reactor (29) based on a difference between the first detection result (Vac1) with the gain corrected and the second detection result (Vac2) with the gain corrected.

Such features make it possible to obtain a highly accurate across voltage (VL), of the reactor (29), with the influence of the carrier noise canceled.

A seventh aspect is an embodiment of any one of the first to sixth aspects. In the seventh aspect, the calculation unit (40) may: calculate, as a first value, a value correlating with an average value per the predetermined time period of an integrated value of the across voltage (VL) of the reactor (29); calculate, as a second value, a value correlating with an average value per the predetermined time period of a sum of a derivative value of the across voltage (Vdc) of the capacitor (26) and the current (Iinv) downstream of the capacitor (26); and correct the gains of the detection results (Vac1, Vac2) of the voltage detection circuit (33) so that, when the first value matches the second value, the value correlating with the average value per the predetermined time period of the estimated power source current (Iin) matches the value correlating with the average value per the predetermined time period of the current (Iinv) downstream of the capacitor (26).

Such features make it possible to correct with high accuracy the gains of the detection results (Vac1, Vac2) of the voltage detection circuit (33).

An eighth aspect is an embodiment of the seventh aspect. In the eighth aspect, the predetermined time period may be set to a half period of the AC power source (91).

A ninth aspect is an embodiment of any one of the first to eighth aspects. In the ninth aspect, the calculation unit (40) may: calculate, as a third value, the power source current (Iin1) based the integrated value of the across voltage (VL) of the reactor (29); calculate, as a fourth value, the power source current (Iin2) based on the derivative value of the across voltage (Vdc) of the capacitor (26); correct offsets of the detection results (Vac1, Vac2) of the voltage detection circuit (33) so that a phase of the third value matches a phase of the fourth value; and obtain the across voltage (VL) of the reactor (29) based on the detection results (Vac1, Vac2), of the voltage detection circuit (33), with the offsets corrected.

Such features make it possible to correct with high accuracy the offsets of the detection results (Vac1, Vac2) of the voltage detection circuit (33). Furthermore, the across voltage (VL) of the reactor (29) can be obtained more accurately based on the detection results (Vac1, Vac2), of the voltage detection circuit (33), with not only the gains but also the offsets corrected. Hence, the power source current (Iin) to be estimated based on the across voltage (VL) can be brought closer to an actual value.

A tenth aspect is an embodiment of ninth aspect. In the tenth aspect, the calculation unit (40) may: calculate amplitudes (inn_amp1, inn_amp2) each for one of the third value and the fourth value with predetermined-high frequency waves of a power source frequency; when the amplitudes (inn_amp1, inn_amp2) are larger than a predetermined value, correct the offsets of the detection results (Vac1, Vac2) of the voltage detection circuit (33); and, when the amplitudes (inn_amp1, inn_amp2) are smaller than the predetermined value, keep from correcting the offsets of the detection results (Vac1, Vac2) of the voltage detection circuit (33).

If the amplitudes (inn_amp1, inn_amp2) of the frequency component of the power source frequency are relatively small, the phases of the third value and the fourth value might not be accurately calculated. In contrast, here, when the amplitudes (inn_amp1, inn_amp2) are larger than a predetermined value, it is determined that the phases of the third value and the fourth value can be accurately calculated, and the offsets are corrected using the phases. Such features make it possible to reduce deterioration in accuracy when the offsets are corrected.

An eleventh aspect is an embodiment of any one of the first to eighth aspects. In the eleventh aspect, the calculation unit (40) may: obtain an average value of the detection results (Vac1, Vac2) in a section, of one period of the AC power source (91), in which the detection results (Vac1, Vac2) of the voltage detection circuit (33) are not dominant, and, using the average value, correct the offsets of the detection results (Vac1, Vac2) of the voltage detection circuit (33); and obtain the across voltage (VL) of the reactor (29) based on the detection results (Vac1, Vac2), of the voltage detection circuit (33), with the offsets corrected.

The average value of the detection results (Vac1, Vac2) in the section in which the detection results (Vac1, Vac2) of the voltage detection circuit (33) are not dominant corresponds to the shift of the offsets. Such features make it possible to easily obtain the shift of the offsets of the detection results (Vac1, Vac2) of the voltage detection circuit (33). Furthermore, the current estimating device (10) can obtain the across voltage (VL) of the reactor (29) with higher accuracy, using the detection results (Vac1, Vac2), of the voltage detection circuit (33), with the offsets corrected.

A twelfth aspect is an embodiment of any one of the first to eighth aspects. In the twelfth aspect, the calculation unit (40) may: calculate a power source voltage (Vin) of the AC power source (91) based on the detection results (Vac1, Vac2) of the voltage detection circuit (33); correct the offsets of the detection results (Vac1, Vac2) of the voltage detection circuit (33), using a voltage value of the power source voltage (Vin) near a zero cross of the AC power source (91); and obtain the across voltage (VL) of the reactor (29) based on the detection results (Vac1, Vac2), of the voltage detection circuit (33), with the offsets corrected.

A voltage value of the power source voltage (Vin) near the zero cross section of the AC power source (91) corresponds to the shift of the offsets. Such features make it possible to easily obtain the shift of the offsets of the detection results (Vac1, Vac2) of the voltage detection circuit (33). Furthermore, the current estimating device (10) can obtain the across voltage (VL) of the reactor (29) with higher accuracy, using the detection results (Vac1, Vac2), of the voltage detection circuit (33), with the offsets corrected.

A thirteenth aspect is an embodiment of any one of the ninth to twelfth aspects. In the thirteenth aspect, the calculation unit (40) may correct the gains of the detection results (Vac1, Vac2) of the voltage detection circuit (33), and then corrects the offsets of the detection results (Vac1, Vac2) of the voltage detection circuit (33).

The offsets are additionally corrected with the gains previously corrected. Such a feature allows the offsets to be easily corrected in the offset correction.

A fourteenth aspect is an embodiment of any one of the ninth to thirteenth aspects. In the fourteenth aspect, the reactor (29) may be connected between the AC power source (91) and the rectifying circuit (21).

A fifteenth aspect is directed to a power converter including the current estimating device (10) of any one of the first to fourteenth aspects.

A sixteenth aspect is directed to a current estimation method to be used for a power converter (1) and for estimating a power source current (Iin) which is a current upstream of a capacitor (26), the power converter (1) including: a rectifying circuit (21) rectifying an AC power output from an AC power source (91); an inverter circuit (27) supplied with power from the rectifying circuit (21); the capacitor (26) connected between the rectifying circuit (21) and the inverter circuit (27) in parallel with the rectifying circuit (21); and a reactor (29) connected between the AC power source (91) and the capacitor (26), the current estimation method comprising: detecting, by a voltage divider circuit including a plurality of resistances (34a to 34c, 35a to 35c), voltages (Vac1, Vac2) correlating with a power source voltage (Vin) of the AC power source (91); first estimating including: obtaining an across voltage (VL) of the reactor (29) based on the voltages (Vac1, Vac2) correlating with the power source voltage (Vin) of the AC power source (91); and estimating the power source current (Iin) based on the across voltage (VL); correcting gains of the voltages (Vac1, Vac2) correlating with the detected power source voltage (Vin) of the AC power source (91) so that a value correlating with an average value per predetermined time period of the estimated power source current (Iin) matches a value correlating with an average value per the predetermined time period of a current (Iinv) downstream of the capacitor (26); and second estimating including: obtaining the across voltage (VL) of the reactor (29) based on the voltages (Vac1, Vac2), with the gains corrected, correlating with the power source voltage (Vin) of the AC power source (91); and estimating the power source current (Iin) based on the obtained across voltage (VL) of the reactor (29).

Here, the voltages (Vac1, Vac2) correlating with the power source voltage (Vin) are detected by the voltage divider circuit. However, the detection results (Vac1, Vac2) are not used as they are for estimation of the power source current. The detection results (Vac1, Vac2) receive gain correction, and then are used for estimation of the power source current (Iin). In particular, the gains are corrected so that a value correlating with an average value per predetermined time period of the estimated power source current (Iin) match a value correlating with an average value per predetermined time period of the current (Iinv) downstream of the capacitor (26). Here, examples of "the value correlating with the average value" include an average value itself per predetermined time period of the currents (Iin, Iinv), and an integrated value per predetermined time period of the currents (Iin, Iinv). The fact that the value relating to the estimated power source current (Iin) matches the value related to the current (Iinv) downstream of the capacitor (26) means that a value obtained by calculation and correlating with an average value per predetermined time period of the current (Ic) flowing through the capacitor (26) converges to 0.

In this current estimation method, the gains of the detection results (Vac1, Vac2) of the voltage divider circuit are corrected, and the across voltage (VL) of the reactor (29) is obtained based on the detection results (Vac1, Vac2) with the gains corrected, and the power source current (Iin) is estimated based on the across voltage (VL). Thus, this the current estimation method can accurately calculate the power source current (Iin) using the voltage divider circuit which is relatively simple in configuration as the voltage detecting means without using a current sensor or a current detecting circuit.

Advantages of the Invention

The aspects of the present disclosure can accurately calculate a power source current (Iin) using a voltage detection circuit (33) which is relatively simple in configuration without using a current sensor or a current detection circuit.

BRIEF DESCRIPTION OF THE DRAWINGS

FIG. 17 is a list of correction processes recommended to be performed in each of the circuit patterns of the first to fifth embodiments.

DESCRIPTION OF EMBODIMENTS

Embodiments of the present disclosure will now be described in detail with reference to the drawings. The embodiments below are merely exemplary ones in nature, and are not intended to limit the scope, applications, or use of the present invention.

First Embodiment

<Outline>

Figure 1:
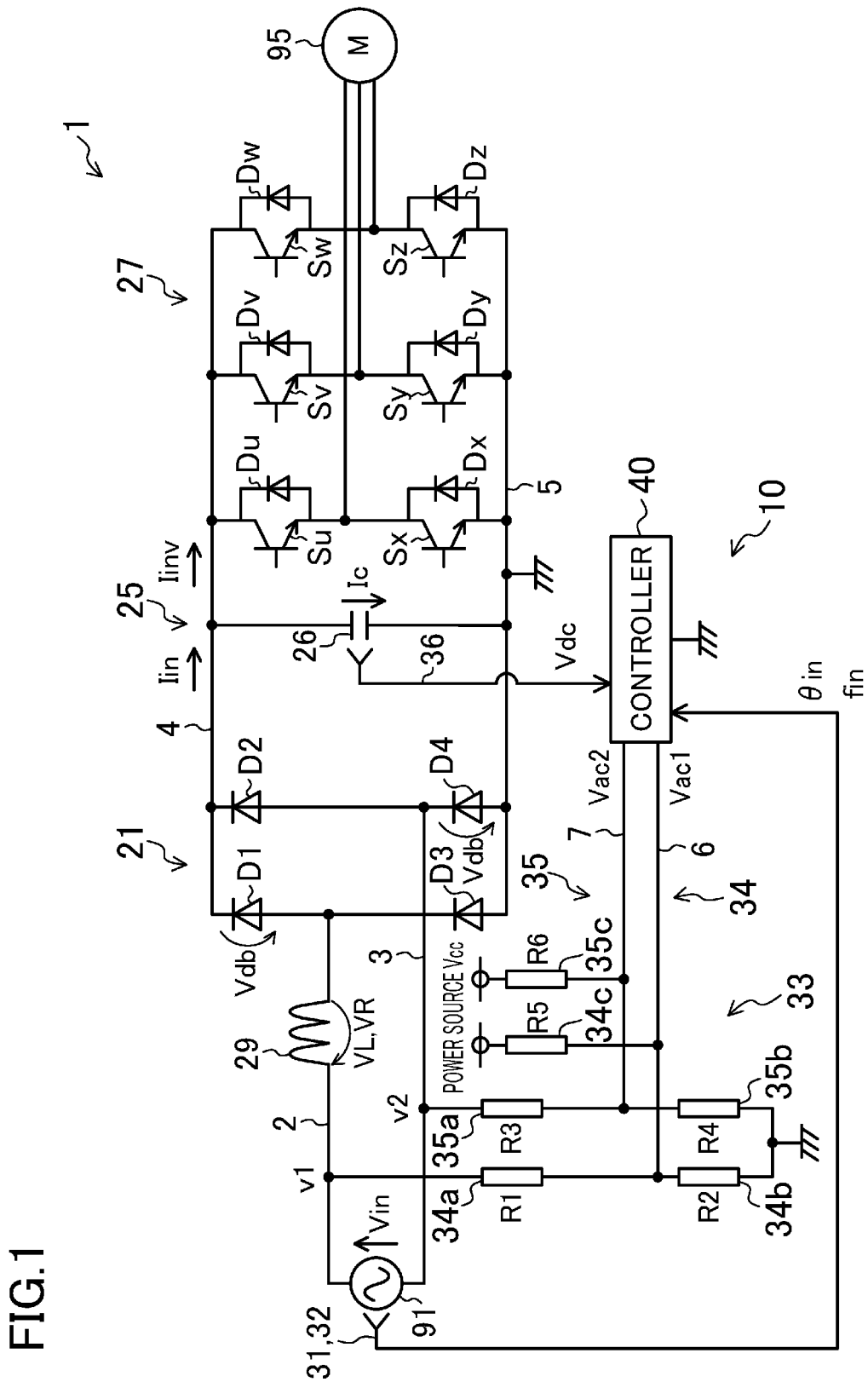
FIG. 1 is a schematic configuration diagram showing a power converter and a current estimating device according to a first embodiment.

As shown in FIG. 1, the power converter (1) is connected to, for example, a single-phase AC power source (91), and is connected to a motor (95). When AC power is supplied from an AC power source (91), the power converter (1) converts the AC power into electric power of a predetermined frequency in an inverter circuit (27), and outputs the electric power to the motor (95). In other words, the power converter (1) is a device for driving the motor (95).

Note that the motor (95) is a three-phase AC motor, and is used for driving a compressor connected to a refrigerant circuit of an air conditioner, for example.

In particular, the power converter (1) includes a current estimating device (10) capable of accurately obtaining a power source current (Iin) for controlling the inverter circuit (27) without using a current sensor and a current detection circuit. The current estimating device (10) includes a voltage detection circuit (33) including a voltage divider circuit having a relatively simple configuration, and obtains a voltage (VL) to be applied to the reactor (29) from the detection result of the circuit (33), and can estimate the power source current (Iin) as accurately as possible using the voltage (VL).

<Configuration of Power Converter and Current Estimating Device>

The power converter (1) according to the first embodiment includes a converter circuit (21) (corresponding to a rectifying circuit), a DC link unit (25), an inverter circuit (27), a reactor (29), and a current estimating device (10). The current estimating device (10) includes various detection circuits (31, 32, 33, 36) and a controller (40) (corresponding to a calculation unit).

—Converter Circuit—

The converter circuit (21) is connected to an AC power source (91) via wirings (2, 3). The converter circuit (21) is a so-called diode bridge circuit in which a plurality of diodes (four in FIG. 1) (D1 to D4) are connected in a bridge configuration.

Specifically, each cathode terminal of the diodes (D1, D2) is connected to the power source wiring (4), and each anode terminal of the diodes (D3, D4) is connected to a GND wiring (5). A connection node between an anode terminal of the diode (D1) and a cathode terminal of the diode (D3) is connected to the wiring (2), and a connection node between an anode terminal of the diode (D2) and a cathode terminal of the diode (D4) is connected to the wiring (3).

The converter circuit (21) rectifies an alternating current output from the AC power source (91) into a direct current.

Note that the wiring (2) connects a positive output terminal of the AC power source (91) and the connection node of the diodes (D1, D3) together. The wiring (3) connects a negative output terminal of the AC power source (91) and the connecting node of the diodes (D2, D4) together.

—DC Link Unit—

The DC link unit (25) has a capacitor (26). A capacitor (26) is connected in parallel with the converter circuit (21) on the output side of the converter circuit (21). In other words, the capacitor (26) is connected between the power source wiring (4) and the GND wiring (5).

The capacitor (26) is configured as, for example, a film capacitor. The capacitance of the capacitor (26) is an electrostatic capacitance capable of smoothing a ripple voltage (voltage fluctuation) generated according to a frequency of a switching operation of switching elements (Su, Sv, Sw, Sx, Sy, and Sz) in the inverter circuit (27), but may be an electrostatic capacitance which cannot smooth a voltage (a voltage fluctuation caused by a power source voltage) rectified by the converter circuit (21). That is to say, the capacitor (26) absorbs the voltage fluctuation caused by the switching of the inverter circuit (27) without absorbing the voltage fluctuation of the converter circuit (21). The DC link unit (25) receives an output of the converter circuit (21) and outputs a DC link voltage (Vdc) having a pulsation of approximately twice the power of the power source voltage (Vin) of the AC power source (91) from both ends of the capacitor (26). That is to say, the DC link voltage (Vdc) corresponds to the across voltage the capacitor (26). The DC link voltage (Vdc) has a large pulsation the maximum value of which is larger than or equal to approximately twice the minimum value of the pulsation.

—Inverter Circuit—

The inverter circuit (27) is connected in parallel with the capacitor (26) of the DC link unit (25) on the output side of the converter circuit (21). The inverter circuit (27) is supplied with power from the converter circuit (21) via the DC link unit (25). The inverter circuit (27) includes a plurality of switching elements (Su, Sv, Sw, Sx, Sy, and Sz) (six due to the three-phase AC in FIG. 1) connected in a bridge configuration.

Specifically, the inverter circuit (27) has three switching legs each of which connects two switching elements (Su and Sx, Sv and Sy, Sw and Sz) together in series. On each switching leg, a connecting node between the upper-arm switching element (Su, Sv, Sw) and the lower-arm switching element (Sx, Sy, Sz) is connected to a coil (not shown) of each phase of the motor (95).

Furthermore, the inverter circuit (27) has a plurality of freewheeling diodes (Du, Dv, Dw, Dx, Dy, Dz) (six in FIG. 1). Each of the freewheeling diodes (Du, Dv, Dw, Dx, Dy, Dz) is connected in antiparallel to a corresponding one of the switching elements (Su, Sv, Sw, Sx, Sy, Sz).

Through an on/off operation of these switching elements (Su, Sv, Sw, Sx, Sy, Sz), the inverter circuit (27) having such a configuration switches the DC link voltage (Vdc) to convert the DC link voltage (Vdc) into a three-phase AC voltage. The three-phase AC voltage is supplied to the motor (95).

—Reactor—

A reactor (29) is provided on the wiring (2) between AC power source (91) and the converter circuit (21).

In the first embodiment, an across voltage (VL) of the reactor (29) is calculated by calculation and used for estimating the power source current (Iin), which will be described later.

—Various Detection Circuits—

Examples of the various detection circuits (31, 32, 33, 36) include: a power source phase detection circuit (31) for detecting a power source phase (θin) of the AC power source (91); a power source frequency detection circuit (32) for detecting a frequency (fin) of a power source voltage (Vin) of the AC power source (91); a voltage detection circuit (33) for detecting voltages (Vac1, Vac2) correlating with the power source voltage (Vin); and a DC voltage detection circuit (36) for detecting a DC link voltage (Vdc) of the DC link unit (25).

Although not shown in the drawing, the power converter (1) also has a detection unit that detects a current (Iinv) flowing on a downstream side of the capacitor (26) (i.e., on the side of the inverter circuit (27)).

—Voltage Detection Circuit—

In particular, as shown in FIG. 1, the voltage detection circuit (33) includes a plurality of resistances (34a to 34c, 35a to 35c) (six in FIG. 1). Specifically, the voltage detection circuit (33) includes: a first voltage detection unit (34) corresponding to a voltage (V1), of the power source voltage (Vin), from a positive side output of the AC power source (91) (hereinafter referred to as a positive side voltage); and a second voltage detection unit (35) corresponding to a voltage (V2), of the power source voltage (Vin), from a negative side output of the AC power source (91) (hereinafter referred to a negative side voltage). The first voltage detection unit (34) includes the resistances (34a to 34c), and the second voltage detection unit (35) includes the resistances (35a to 35c).

In the first voltage detection unit (34), one end of the resistance (34a) is connected between the AC power source (91) and the reactor (29) on the wiring (2). One end of the resistance (34b) is connected to the GND. The other end of the resistance (34a) and the other end of the resistance (34b) are connected to the controller (40) via a wiring (6). The resistance (34c) has one end connected to a power source having a voltage value (Vcc) and the other end connected to the wiring (6).

In the second voltage detection unit (35), one end of the resistance (35a) is connected to the wiring (3). One end of the resistance (35b) is connected to the GND. The other end of the resistance (35a) and the other end of the resistance (35b) are connected to the controller (40) via a wiring (7). The resistance (35c) has one end connected to a power source having a voltage value (Vcc) and the other end connected to the wiring (7).

In other words, each of the first voltage detection unit (34) and the second voltage detection unit (35) includes a different voltage divider circuit.

With this configuration, the first voltage detection unit (34) detects, as a first detection result (Vac1), a voltage obtained through division of the positive side voltage (V1) of the AC power source (91) using the resistances (34a to 34c). The second voltage detection unit (35) detects, as a second detection result (Vac2), a voltage obtained through division of the negative side voltage (V2) of the AC power source (91) using the resistances (35a to 35c). Specifically, if the resistance values of the resistances (34a to 34c, 35a to 35c) are respectively defined as "R1, R2, R3, R4, R5, R6," each of the first and second detection results Vac1 and Vac2 is expressed by the following equations:

[Math. 1]
$$Vac1 = \frac{R_{L1}}{R_{L1} + R1} \times V1 + \frac{R1}{R_{L1} + R1} \times \frac{R2}{R2 + R5} \times Vcc \quad (1)$$

[Math. 2]
$$Vac2 = \frac{R_{L2}}{R_{L2} + R3} \times V2 + \frac{R3}{R_{L2} + R3} \times \frac{R4}{R4 + R6} \times Vcc \quad (2)$$

Note that "RL1" and "RL2" are expressed by the following equations.

$$R_{L1} = \frac{R2 \times R5}{R2 + R5} \quad \text{[Math. 3]}$$

$$R_{L2} = \frac{R4 \times R6}{R4 + R6} \quad \text{[Math. 4]}$$

The first and second detection results (Vac1, Vac2) obtained through the above Equations (1) and (2) are input to the controller (40). In the controller (40), basically, a difference between the first detection result (Vac1) and the second detection result (Vac2) is calculated, and the power source voltage (Vin) is obtained using the calculation result.

In particular, as described above, the voltage detection circuit (33) according to first embodiment is configured to detect the voltages (Vac1, Vac2) respectively corresponding to the positive side voltage (V1) and the negative side voltage (V2) at a position between the AC power source (91) and the converter circuit (21), i.e., the voltages (Vac1, Vac2) correlating with the power source voltage (Vin) of the AC power source (91). Therefore, even when each diode (D1 to D4) of the converter circuit (21) is not conductive, the voltage detection circuit (33) can detect the voltages (Vac1, Vac2).

Figure 2:
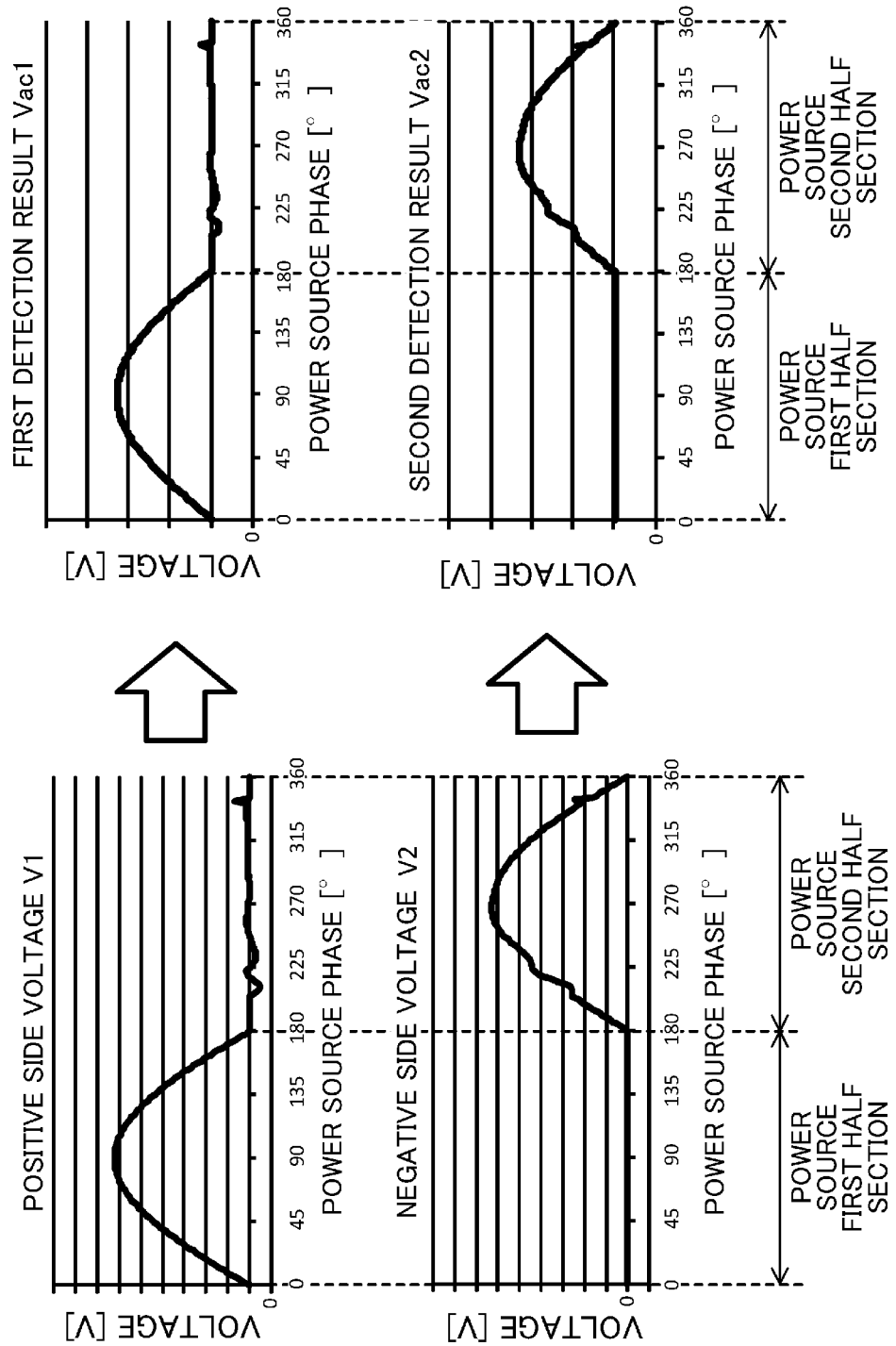
FIG. 2 illustrates diagrams showing voltage waveforms of a positive side voltage and a negative side voltage of the AC power source, and the waveforms of detection results of first and second voltage detection units respectively corresponding to the voltage waveforms of the positive and negative side voltages of the AC power source.

FIG. 2 shows side by side waveforms of the first and second detection results (Vac1, Vac2) and waveforms of the positive and negative side voltages (V1, V2) respectively corresponding to the first and second detection results (Vac1, Vac2). As clearly shown in FIG. 2, when the power source phase (θin) is in the range of 0 degree to 180 degrees, it can be said that the first detection result (Vac1) and the positive side voltage (V1) appear more apparently than the second detection result (Vac2) and the negative side voltage (V2) do. Conversely, when the power source phase (θin) is in the range of 180 degrees to 360 degrees, it can be said that the second detection result (Vac2) and the negative side voltage (V2) appear more apparently than the first detection result (Vac1) and the positive side voltage (V1) do. Hereinafter, for convenience of explanation, a section in which the power source phase (θin) is 0 degree to 180 degrees is referred to as a "power source first half section", and a section in which the power source phase (θin) is 180 degrees to 360 degrees is referred to as a "power source second half section."

However, the definition of the power source first half section and the power source second half section is not limited to the above, and for example, the power source first half section may be 180 degrees to 360 degrees, and the power source second half section may be 0 degree to 180 degrees.

Note that the first detection result (Vac1) is a value obtained through division of the positive side voltage (V1), and therefore, even if the positive side voltage (V1) is approximately 0 V in the power source second half section, the first detection result (Vac1) is not 0 V. Similarly, since the second detection result (Vac2) is a value obtained through division of the negative side voltage (V2), the second detection result (Vac2) is not 0 V even if the negative side voltage (V2) is approximately 0 V in the power source first half section.

<Controller>

The controller (40) is a microcomputer including, for example, a CPU and a memory. The controller (40) is connected to the various detection circuits (31, 32, 33, 36), and is connected to the gate terminals of the switching elements (Su, Sv, Sw, Sx, Sy, and Sz) of the inverter circuit (27), although not shown in the drawing. The controller (40) controls ON/OFF of the switching elements (Su, Sv, Sw, Sx, Sy, Sz) so that the motor (95) can rotate at a desired rotational speed on the basis of the detection results of the various detection circuits (31, 32, 33, 36).

In particular, the controller (40) of this first embodiment accurately obtains the across voltage (VL) of the reactor (29) using the first and second detection results (Vac1, Vac2) input from the voltage detection circuit (33). Then, based on the calculated across voltage (VL) of the reactor (29), the controller (40) accurately estimates the power source current (Iin) for use in the inverter control including the control of the harmonics of the power source.

Described below is the reason why the power source current (Iin) is estimated in this first embodiment. As described above, in the case where the capacitor (26) is so small in capacitance, and can smooth only a ripple voltage generated corresponding to a switching frequency of the switching elements (Su, Sv, Sw, Sx, Sy, Sz) in the inverter circuit (27), such a capacitor (26) cannot smooth a ripple voltage caused by a power source frequency of the AC power source (91) so that a harmonics of the power source is likely to be generated in the capacitor (26). Therefore, the controller (40) controls the driving of the switching elements (Su, Sv, Sw, Sx, Sy, Sy, Sz) in the inverter circuit (27) so as to minimize the power harmonics of the power source. In order to perform such control, the power source current (Iin) is needed. Typically, the power source current (Iin) is detected using a current detection circuit using a current transformer (CT) and a shunt resistance. However, these methods have problems that the CT itself is relatively expensive, and that a large number of components is required for the current detection circuit, making the configuration complex.

On the other hand, in this first embodiment, when the first and the second detection results (Vac1, Vac2) which are the voltages correlating with the power source voltage (Vin) are detected by the voltage detection circuit (33), the across voltage (VL) the reactor (29) is accurately calculated on the basis of the first and second detection results (Vac1, Vac2), and the power source current (Iin) is estimated on the basis of the obtained across voltage (VL) of the reactor (29). In other words, in the first embodiment, the CT and the current detection circuit for detecting the power source current (Iin) are not required. Therefore, the current estimating device (10) according to the first embodiment is more simple in configuration than a method of directly detecting the power source current (Iin) by the CT and the current detection circuit, and thus, can reduce an increase in cost.

<Method of Accurately Detecting Power Source Current>

Next, the calculation of the across voltage (VL) of the reactor (29) and the estimation of the power source current (Iin) will be described in detail.

Figure 3:
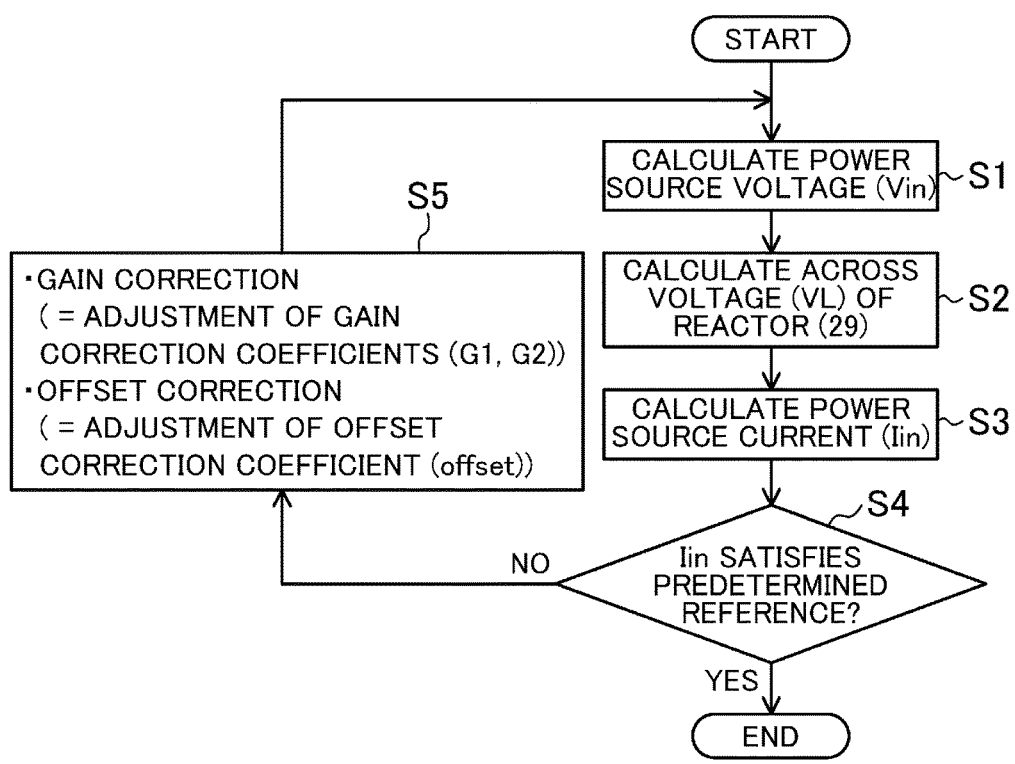
FIG. 3 is a flow chart showing an overall flow of the process performed by a controller.

FIG. 3 is a flow chart briefly showing a flow of overall processing performed by the controller (40). As shown in FIG. 3, as a general flow, the controller (40) calculates the power source voltage (Vin) using the first and second detection results (Vac1, Vac2) of the voltage detection circuit (33) (Step S1). Thereafter, the controller (40) calculates the across voltage (VL) of the reactor (29) (Step S2). Thereafter, the controller (40) calculates the power source current (Iin) (Step S3). If the power source current (Iin) thus obtained satisfies a predetermined reference (Yes in Step S4), the series of processing shown in FIG. 3 ends, and the power source current (Iin) is used for the inverter control. However, if the obtained power source current (Iin) does not satisfy the predetermined reference (No in Step S4), the controller (40) repeats the operations of Step S1 and subsequent steps. When repeating the operations from Step S1 and thereafter, the controller (40) corrects gains and offsets of the first and second detection results (Vac1, Vac2) of the voltage detection circuit (33) (Step S5).

—Calculation of Power Source Voltage (Vin) (Step S1)—

In the first term of the right side of Equation (1), "$R_{L1}/(R_{L1}+R1)$" represents the gain of the first detection result (Vac1), and "$R_{L2}/(R_{L2}+R3)$" of the first term of the right side of the Equation (2) represents the gain of the second detection result (Vac2). In the second term of the right side of the above Equation (1), the portion "(R1/($R_{L1}$+R1))"×(R2/(R2+R5))" represents an offset of the first detection result (Vac1). In the second term of the right side of the above Equation (2), the portion "(R3/($R_{L2}$+R3))"×(R4/(R4+R6))" represents an offset of the detection result (Vac2). In these gains and offsets, variations occur due to individual differences in the components (e.g., resistances) of the first and second detection results (Vac1, Vac2) and the temperature characteristics of the components, and, due to those variations, a detection error is generated in the voltage detection circuit (33).

—Gain Correction and Offset Correction (Step S5)—

According to the following Equation (3), the controller (40) corrects the gains and offsets of the first and second detection results (Vac1, Vac2) of the voltage detection circuit (33).

[Math. 5]

$$Vin = Vac1 \times G1 - Vac2 \times G2 + \text{Offset} \quad (3)$$

The coefficient "G1" represents a gain correction coefficient for correcting a gain of the first detection result (Vac1). The coefficient "G2" represents a gain correction coefficient for correcting a gain of the second detection result (Vac2). The coefficient "Offset" represents an offset correction coefficient (i.e., a shift amount of offset). As shown in Equation (3), the controller (40) multiplies each of the voltages (Vac1, Vac2), which is a detection result of the voltage detection circuit (33), by the gain correction coefficients (G1, G2), and then subtracts the multiplication result from each other. Thus, the controller (40) can obtain the power source voltage (Vin) with the influence of the carrier noise canceled and the gain corrected. Furthermore, the controller (40) can obtain the power source voltage (Vin) with the offset further corrected by adding the offset correction coefficient (offset) to the value obtained through the subtraction of the multiplication results.

In this first embodiment, in order to obtain the power source voltage (Vin) with high accuracy in the above Equation (3), the gains and the offsets are corrected through gradual adjustment of the gain correction coefficients (G1, G2) and the offset correction coefficient (offset) to be used in the above Equation (3). As clearly shown in FIG. 3, the gains and the offsets are repeatedly corrected (Step S5) until the power source current (Iin) satisfies a predetermined reference. The adjustment of the gain correction coefficients (G1, G2) and the offset correction coefficient (offset) will be described in detail in "<Adjustment Processing of Gain Correction Coefficient>" and "<Adjustment Processing of Offset Correction Coefficient>."

—Calculation of Across Voltage (VL) of Reactor (29) (Step S2)—

After step S1, the controller (40) obtains the across voltage (VL) of the reactor (29) using the power source voltage (Vin) obtained according to the above Equation (3). In the circuit configuration of the power converter (1), an absolute value of the power source voltage (Vin) is equal to a sum of the across voltage (VL) of the reactor (29) and the DC link voltage (Vdc) (|Vin|=VL+Vdc). Therefore, the across voltage (VL) of the reactor (29) can be obtained through the subtraction of the DC link voltage (Vdc) detected by the DC voltage detection circuit (36) from the absolute value of the power source voltage (Vin) obtained through the above method (VL=|Vin|−Vdc).

However, in the reactor (29), a voltage drop occurs due to the resistance component of the reactor (29) itself. In addition, in the converter circuit (21), a voltage drop is observed in the two (D1, D4) of the diodes (D1 to D4) connected in a bridge configuration. Therefore, even if the DC link voltage (Vdc) is simply subtracted from the absolute value of the power source voltage (Vin), it is difficult to accurately obtain the across voltage (VL) of the reactor (29).

Therefore, when determining the across voltage (VL) of the reactor (29), the controller (40) according to this first embodiment uses, as shown in the following Equation (4), a voltage drop (VR) of the reactor (29) and a voltage drop (2Vdb) generated in the diodes (D1 to D4) of the converter circuit (21) (more specifically, a voltage drop in the two diodes (D1, D4)) in addition to the power source voltage (Vin) and the DC link voltage (Vdc).

[Math. 6]

$$VL = |Vin - VR - 2Vdb| - Vdc \quad (4)$$

According to the above Equation (4), the controller (40) can obtain the across voltage (VL) of the reactor (29), closer to the actual value.

It is preferable that each value for the two voltage drops (VR, 2Vdb) in the above Equation (4) is determined with thorough calculation. This is because, as these values shift from actual values, the calculation error of the across voltage (VL) of the reactor (29) becomes large. In particular, as will be described later, since the power source current (Iin) is calculated by an integration operation according to the following Equation (5), if each value for the voltage drops (VR, 2Vdb) is not calculated with high accuracy, a large influence is also exerted on the calculation of the power source current (Iin). Accordingly, each value for the voltage drops (VR, 2Vdb) may be an appropriate value obtained through, e.g., an operation, or an actual detection operation. For example, when the voltage drop (VR) of the reactor (29) is detected by a detection circuit (not shown), it is preferable that an error in the detection circuit including the detection gain and the offset is appropriately corrected to minimize the calculation error.

—Calculation of Power Source Current (Iin) (Step S3)—

Next, in Step S2, the controller (40) obtains the power source current (Iin) using the across voltage (VL) of the reactor (29) obtained through the above Equation (4).

Specifically, as shown in the following Equation (5), the controller (40) estimates the power source current (Iin) by integrating the across voltage (VL) of the reactor (29).

[Math. 7]

$$Iin1 = \int \frac{VL}{L} dt \quad (5)$$

If the power source current (Iin) is calculated, there is also a method of the following Equation (6) which is different from the Equation (5) and focuses on the circuit configuration. In the circuit configuration of the power converter (1) according to FIG. 1, the power source current (Iin), which is an upstream current of the capacitor (26), is equal to the sum of the current (Iinv) flowing toward the inverter circuit (27), which is the current downstream of the capacitor (26), and the current (Ic) flowing toward the capacitor (26) (Iin=Iinv+Ic). Therefore, in the following Equation (6), it is shown that the power source current (Iin) is obtained through addition of the current (Ic) flowing through the capacitor (26) obtained through the differentiation of the DC link voltage (Vdc) to the current (Iinv) flowing to the inverter circuit (27) side detected by the detection unit (not shown).

[Math. 8]

$$Iin2 = Iinv + C\frac{dVdc}{dt} \quad (6)$$

In the above Equations (5) and (6), the power source current calculated according to the above Equation (5) is represented as "Iin1" and the power source current calculated according to the above Equation (6) is represented as "Iin2" to tell which equation is used to calculate the power source current (Iin).

However, in the above Equation (6), the capacitor current (Ic) is obtained through differentiation, which is likely to be affected by the high-frequency noise. Therefore, the use of the power source current (Iin2) obtained through the above Equation (6) in, for example, harmonic control without a single-phase capacitor is problematic. Therefore, in the first embodiment, when the power source current (Iin) for controlling the inverter control without the single-phase capacitor is calculated, the power source current (Iin1) calculated using the above Equation (5) is used.

—Determination Whether Power Source Current (Iin) Satisfies Predetermined Criterion (Step S4)—

In order to calculate the power source current (Iin1) in the above Equation (5), it is necessary to perform the calculation using the above Equations (3) and (4). Therefore, the power source current (Iin1) obtained through the Equation (5) is affected by the detection error of the voltage detection circuit (33) itself. Further, if the offset correction and the gain correction are performed, the calculation result of the Equation (3) changes, so that the power source current (Iin1) obtained through the Equation (5) also changes in conjunction with the change.

On the other hand, the power source current (Iin2) obtained through the above Equation (6) is not subjected to the detection error of the voltage detection circuit (33) itself, as clearly shown from the above Equation (6).

Therefore, the controller (40) uses the power source current (Iin1) obtained in the above Equation (6) as a predetermined reference for determining whether the power source current (Iin2) obtained in the Equation (5) is a value with high accuracy. That is, when the gain correction and the offset correction are performed, the controller (40) of this first embodiment determines whether these corrections are appropriately performed in the gain correction and the offset correction based on what value the power source current (Iin1) obtained according to the Equation (5) takes when the power source current (Iin2) obtained according to the Equation (6) is used as a reference. Specifically, although described later, when the power source current (Iin1) obtained according to the above Equation (5) matches the power source current (Iin2) obtained according to the above Equation (6), the control unit (40) determines that the matching is synonymous with the fact that the calculation result of the current (Ic), represented in the second term of the right side of the above Equation (6) and flowing through the capacitor (26), converges to 0, and that the power source current (Iin1) obtained according to the above Equation (5) satisfies the predetermined reference. The controller (40) then determines the power source current (Iin1) obtained according to the above Equation (5) as a parameter for inverter control. However, when the power source current (Iin1) obtained according to the above Equation (5) shifts from the power source current (Iin2) obtained according to the above Equation (6), the controller (40) repeats the gain correction and the offset correction until the power source current (Iin1) matches the power source current (Iin2).

<Adjustment of Gain Correction Coefficient>

Here, the gain correction in FIG. 3 will be described in detail.

The controller (40) of this first embodiment gradually adjusts the gain correction coefficients (G1, G2) so that the gain correction coefficients (G1, G2) for correcting the gain "$R_{L1}/(R_{L1}+R1)$" and "$R_{L2}/(R_{L2}+R3)$" in the first term of the right side of the above Equations (1) and (2) can reliably absorb the variation of the components of the voltage detection circuit (33).

Figure 4:
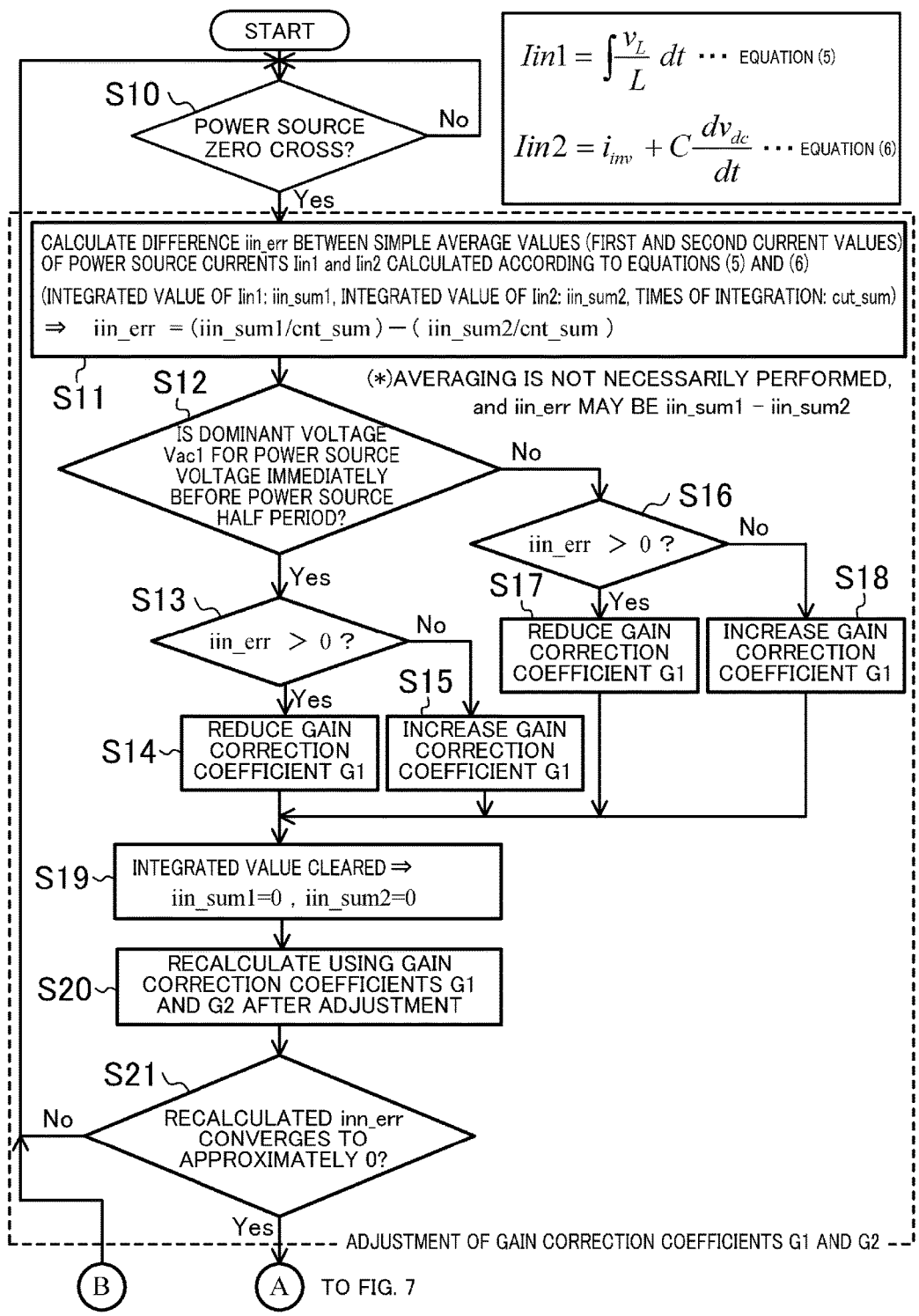
FIG. 4 is a flow chart showing the flow of gain correction.
Figure 5:
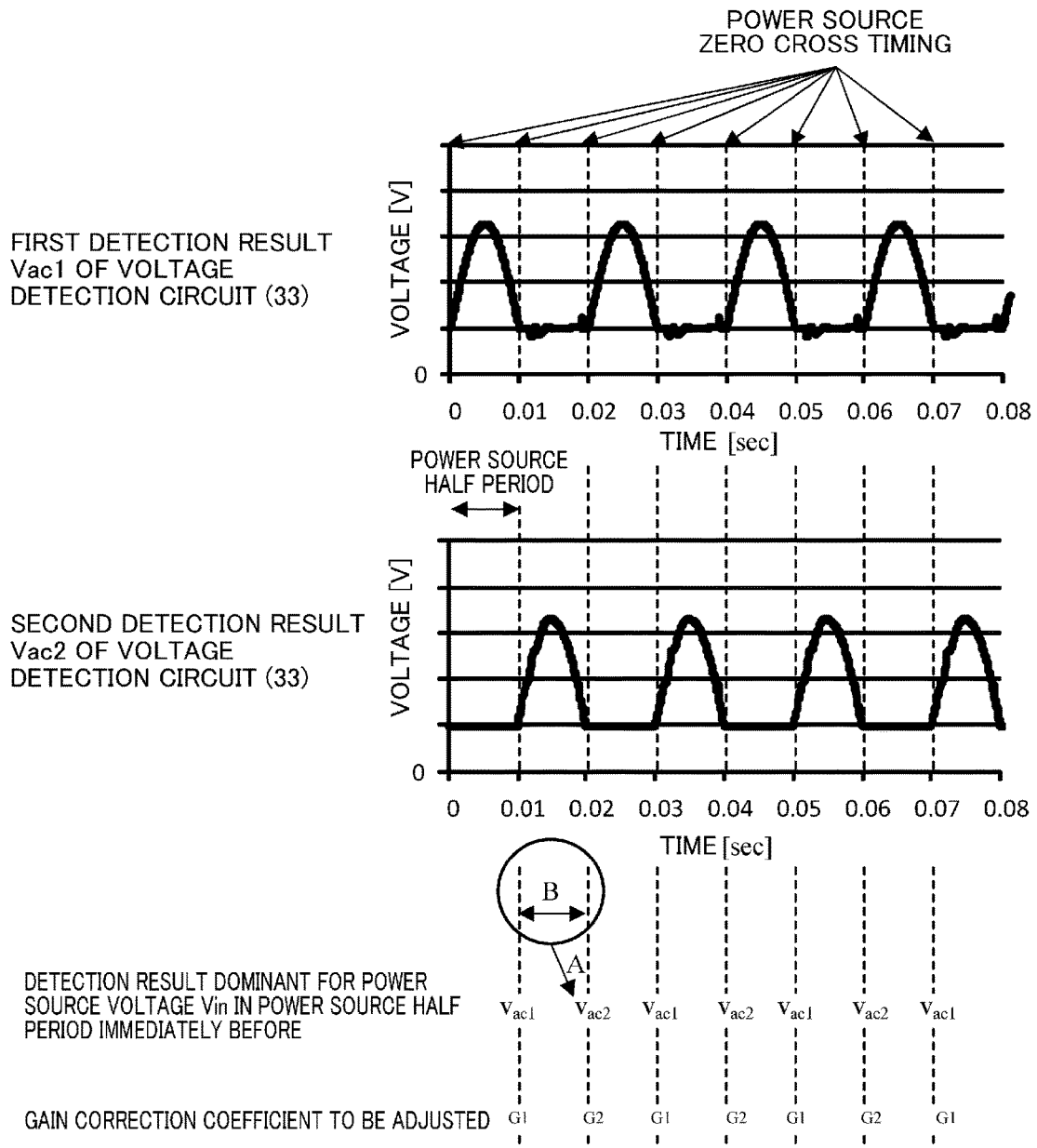
FIG. 5 illustrates graphs for explaining when to correct gains and offsets.

FIG. 4 shows in detail the flow of the adjustment of the gain correction coefficients (G1, G2). FIG. 5 shows the detection results (Vac1, Vac2) of the voltage detection circuit (33) arranged vertically, and also shows, for each of the power source zero-cross, the type of the detection result dominant for the power source voltage (Vin) in the immediately preceding power source half period and the gain correction coefficient to be adjusted.

As a premise, it is assumed that all of the various detection circuits (31, 32, 33, 36) always perform a detection operation regardless of before or after the correction of the gain correction coefficients (G1, G2). It is also assumed that the controller (40) calculates the power source current (Iin1) using the Equations (3) to (5). Furthermore, regardless of before or after the correction of the gain correction coefficients (G1, G2), the controller (40) also calculates the power source current (Iin2), using for the above Equation (6) the current (Iinv) detected by the not-shown detection unit and flowing through the inverter (27) side and the DC link voltage (Vdc) detected by the DC voltage detection circuit (36). These calculation results are sequentially stored in a memory (not shown).

As shown in FIG. 4, the controller (40) obtains the timing of the power source zero cross based on the power source phase (θin) (Step S10). When coming to the timing of the power source zero cross (Yes in Step S10), the controller (40) calculates, as a first value, a value correlating with an average value per predetermined time period (i.e., an average value of the power source current (Iin1) per predetermined time period) of the calculation result according to the above Equation (5); that is, an integrated value of the across voltage (VL) of the reactor (29). Furthermore, the controller (40) calculates, as a second value, a value correlating with an average value per predetermined time period (i.e., an average value of the power source current (Iin2) per predetermined time period) of the sum of the calculation result of the above Equation (6); that is, the derivative value of the DC link voltage (Vdc) and the current (Iinv) flowing through the detected inverter (27) side. For example, the controller (40) integrates for a predetermined time period (iin_sum1) the calculation result (Iin1) of the above Equation (5), and divides this integrated value by the number of integrations cut_sum to calculate the first value which is a simple average value (iin_sum1/cut_sum). Similarly, the controller (40) integrates for a predetermined time period (iin_sum2) the calculation result (Iin2) of the above Equation (6), and divides this integrated value by the number of integrations cut_sum to calculate a second value (iin_sum2/cut_sum) which is a simple average value.

If the gain correction coefficient is adjusted at the timing "A" of the power source zero cross shown in FIG. 5, the predetermined time period is set to the power source half period section "B" immediately before the timing "A". In other words, the controller (40) sets, as the first value, the simple average value of the calculation result (Iin1) of the above Equation (5) in the section B; that is, the power source half period section immediately before the timing "A", and obtains, as the second value, the simple average value of the calculation result (Iin2) according to the above Equation (6) in the same section B.

Next, as shown in FIG. 4, the controller (40) calculates a difference between the first value and the second value (iin_err=(iin_sum1/cut_sum)−(iin_sum2/cut_sum)) (Step S11). In particular, in the first embodiment, the second value for differentiation is used as a reference, and the controller (40) calculates how far the first value shifts from the second value toward the positive side or the negative side.

Note that this first embodiment exemplifies a case in which the first value and the second value are simple average values. Alternatively, the first value and the second value may be values correlating with an average value, and not necessarily be the average value. For example, the first value may be a value itself (iin_sum1) obtained through integration of the calculation result (Iin1) according to the above Equation (5) for a predetermined time, and the second value may be a value itself (iin_sum2) obtained through integration of the calculation result (Iin2) according to the above Equation (6) for a predetermined time.

Next, the controller (40) determines which of the first detection result or the second detection result (Vac1, Vac2) dominant for the power source voltage (Vin) in the power source half period immediately before the power source zero cross at the present moment (Step S12). From the determination result, the controller (40) determines the gain correction coefficients (G1, G2) to be adjusted at the present time.

For example, in the adjustment of the gain correction coefficient at the power source zero cross "A" in FIG. 5, the detection result dominant during the power source half period section "B" immediately before the power source zero cross "A" is "Vac2." Then, the controller (40) determines the gain correction coefficient "G2" corresponding to the detection result "Vac2" as a target to be adjusted.

In Step S12 of FIG. 4, if the determination result is the detection result "Vac1" (Yes in Step S12), the controller (40) determines whether the difference (iin_err) between the first value and the second value obtained in Step S11 is a positive value or a negative value, that is, whether the first value is positive or negative based on the second value (Step S13).

In Step S13, if the difference (iin_err) is a positive value (Yes in Step S13), the controller (40) decreases the gain correction coefficient (G1) (Step S14). On the contrary, if the difference (iin_err) is a negative value (No in Step S13), the controller (40) increases the gain correction coefficient (G1) (Step S15).

In addition, in Step S12, if the determination result is the detection result "Vac2" (No in Step S12), the controller (40) determines in the similar manner as Step S13 whether the difference (iin_err) between the first value and the second value obtained in Step S11 is a positive value or a negative value (Step S16).

In Step S16, if the difference (iin_err) is a positive value (Yes in Step S16), the controller (40) decreases the gain correction coefficient (G2) (Step S17). On the contrary, if the difference (iin_err) is a negative value (No in Step S16), the controller (40) increases the gain correction coefficient (G2) (Step S18).

After Steps S14, S15, S17 and S18, the controller (40) clears the first value and the second value obtained in Step S11 (Step S19).

After Step S19, the controller (40) updates the above Equation (3) by applying to the above Equation (3) the gain correction coefficients (G1, G2) adjusted in Steps S14, S15, S17, and S18. In addition to the above updated Equation (3), the controller (40) sequentially calculates the power source voltage (Vin), the across voltage (VL) of the reactor (29), and the power source current (Iin1) obtained by integration, as sequentially explained in Steps S1 to S3 in FIG. 3, using the above Equations (4) and (5).

Next, at the timing of the power source zero cross at which the power source period has elapsed once from the timing of Step S19, the controller (40) obtains again the first value and the second value in the period of the power source half period immediately before the timing, and calculates the difference (iin_err). The controller (40) determines whether the difference (iin_err) is approximately 0 (i.e., whether the first value matches the second value).

If the difference (iin_err) is not substantially 0 (i.e., if the first value does not match the second value) (No in Step S21), the controller (40) repeats the operations of Step S10 and the subsequent steps again. In Step S21, when the difference (iin_err) is approximately 0 (i.e., when the first value substantially matches the second value) (Yes in Step S21), the controller (40) determines that the gain correction coefficients (G1, G2) have been adjusted to be able to absorb the variation in the voltage detection circuit (33), and ends the series of adjustments of the gain correction coefficients (G1, G2). In other words, Steps S10 to S21 are repeatedly performed until the gain correction coefficient (G1, G2) is adjusted to be able to absorb the variation in the voltage detection circuit (33). When the Step S21 is satisfied, it means that when the first value matches the second value, the value of the current (Ic) (differentiation portion) that flows through the capacitor (26) according to Equation (6), which is a reference of the matching of the gain correction coefficients (G1, G2), and that correlates with an average value for the predetermined time period (i.e., a power source half period) converges to 0. At the same time, this means that a value which correlates with an average value of the estimated power source current (Iin) per predetermined time period corresponds to a value which correlates with an average value of the current (Iinv) flowing through the inverter (27) per predetermined time period.

In Steps S11 to S21 of the gain correction (more specifically, adjustment of the gain correction coefficients), Steps S13 to S15 represent an adjustment process of the gain correction coefficient (G1) contributing to the power source first half section, and Steps S16 to S18 represent an adjustment process of the gain correction coefficient (G2) contributing to the power source second half section.

Figure 6:
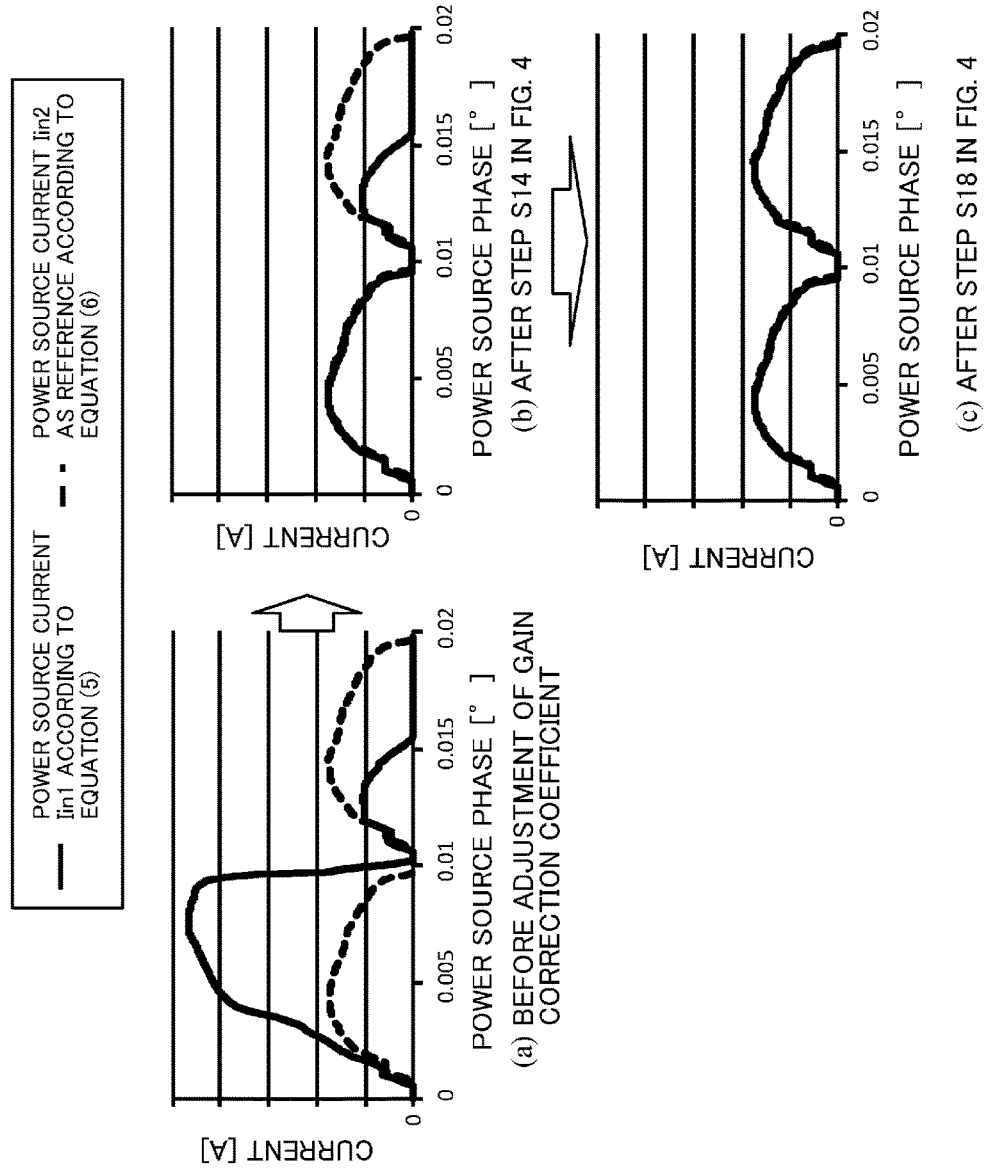
FIG. 6 illustrates graphs illustrating a process performed when the gains are corrected according to FIG. 4 in a case where the gain of the first detection result shifts from the design value toward the positive side and the gain of the second detection result shifts from the design value toward the negative side of the design value.

FIG. 6 illustrates a process of adjusting the gain correction coefficients (G1, G2) described above. First, an illustration (a) in FIG. 6 shows a calculation result (Iin2) of the Equation (6) as a reference and a calculation result (Iin1) of the Equation (5), before the adjustment of the gain correction coefficients (G1, G2) is performed. FIG. 6 exemplifies in the illustration (a) a state in which the gain of the first voltage detection unit (34) is shifted toward the positive side from the design value, and the gain of the second voltage detection unit (35) is shifted toward the negative side from the design value. Then, in the power source first half section in which the first detection result (Vac1) is dominant, the current value of the power source current (Iin1) is higher as a whole with respect to the power source current (Iin2) serving as a reference. On the other hand, in the power source second half section in which the second detection result (Vac2) is dominant, the current value of the power source current (Iin1) is lower as a whole with respect to the power source current (Iin2) serving as a reference.

Here, the case where the gain is shifted from the design value toward the positive side means a case where, because of the influence of the variation of the components, the first voltage detection unit (34) detects a voltage value larger than a voltage value to be actually detected. A shift of the gain from the design value toward the negative side means a case where, because of the influence of the variation of the components, the second voltage detection unit (35) detects a voltage value smaller than a voltage value to be actually detected.

FIG. 6 shows in an illustration (b) a case where Step S14 of FIG. 4 is performed on the power source first half section from the state of the illustration (a) of FIG. 6. In this case, since the gain correction coefficient (G1) contributing to the power source first half section is adjusted to be able to absorb the variation of the first voltage detection unit (34) in Step S14, the power source current (Iin1) according to the recalculated Equation (5) substantially matches the power source current (Iin2) of the Equation (6) serving as a reference. However, in the illustration (b) of FIG. 6, Steps S15 to S17 have not been performed yet. Hence, the power source current (Iin1) and the power source current (Iin2) still shift from each other in the power source second half section.

FIG. 6 shows in an illustration (c) a case where Step S18 of FIG. 4 is performed with respect to the power source second half section from the state of the illustration (b) in FIG. 6. In this case, since the gain correction coefficient (G2) contributing to the power source second half section is adjusted to be able to absorb the variation of the second voltage detection unit (35) in Step S18, the power source current (Iin1) according to the recalculated Equation (5) is substantially equal to the power source current (Iin2) of the Equation (6), serving as a reference, from the power source first half section to the power source second half section.

Therefore, in the illustration (c) of FIG. 6, it can be said that the possibility that an individual difference in the gain of the voltage detection circuit (33) including the first and second voltage detection units (34, 35) influences the estimation of the power source current (Iin1) is reduced.

<Adjustment of Offset Correction Coefficient>

Here, the offset correction in FIG. 3 will be described in detail.

In order that the offset correction coefficient (offset) for correcting the offset portion "$(R1/(R_{L1}+R1))\times(R2/(R2+R5))$" "$(R3/(R_{L2}+R3))\times(R4/(R4+R6))$" in the second terms of the right sides of the above Equations (1) and (2) can reliably absorb variation of components of the voltage detection circuit (33), the controller (40) of this first embodiment further adjusts the offset correction coefficient (offset).

Figure 7:
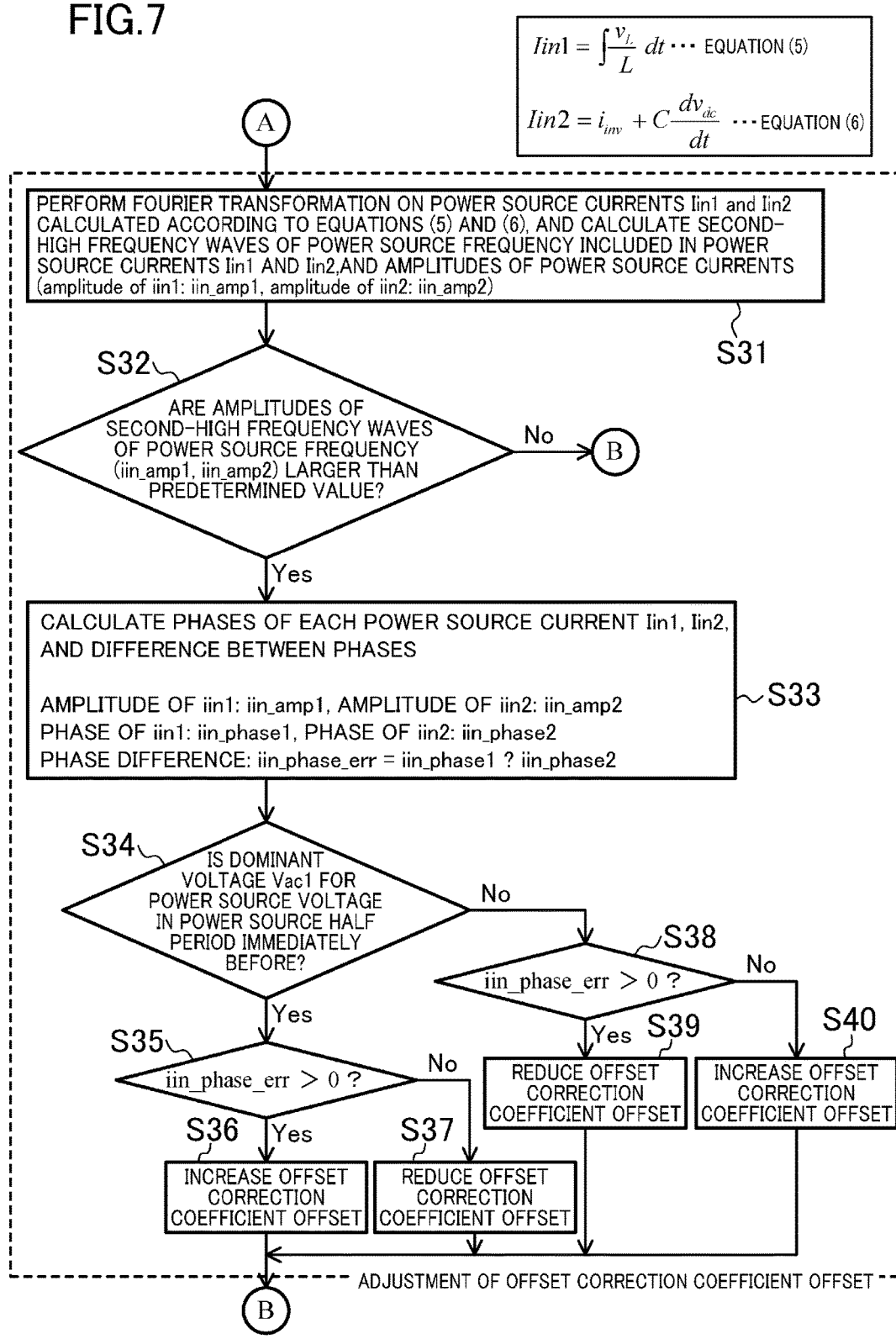
FIG. 7 is a flow chart showing a flow of offset correction performed by the controller.

FIG. 7 shows in detail a flow of the adjustment of the offset correction coefficient (offset). The offset correction according to the first embodiment (i.e., the adjustment of the offset correction coefficient (offset)) is performed after the above-described gain correction in FIG. 4 (i.e., the adjustment of the gain correction coefficients (G1, G2)).

As a premise, it is assumed that all of the detection circuits (31, 32, 33, 36) always perform the detection operation, and the controller (40) calculates the power source current (Iin1) using the above Equations (3) to (5). Furthermore, it is assumed that the controller (40) also calculates the power source current (Iin2) using the DC link voltage (Vdc) detected by the DC voltage detection circuit (36) for the above Equation (6). These calculation results are sequentially stored in a memory (not shown).

As shown in FIG. 7, the controller (40) calculates: the power source current (Iin1) using the above Equation (5); that is, the power source current (Iin1) (corresponding to a third value) based on an integrated value of the across voltage (VL) of the reactor (29); and the power source current (Iin2) using the above Equation (6); that is, the power source current (Iin2) (corresponding to a fourth value) based on a derivative value of the across voltage (Vdc) of the capacitor (26). The controller (40) performs a Fourier transformation on each of these power source currents (Iin1, Iin2). Based on the result of the Fourier transformation, the controller (40) obtains second-high frequency waves of the power source frequency and an amplitude (iin_amp1, iin_amp2) of the second-high frequency waves for each of the power source currents (Iin1, Iin2) (Step S31).

Next, the controller (40) compares each of the amplitudes (iin_amp1, iin_amp2) obtained in Step S31 with a predetermined value (Step S32). If at least one of the amplitudes (iin_amp1, iin_amp2) is larger than the predetermined value, the controller (40) performs as processes the operations of Step S33 and subsequent steps. However, if both of the amplitudes (iin_amp1, iin_amp2) are smaller than the predetermined value (No in Step S32), the controller (40) does not perform the processes after Step S33 (i.e., the offset correction), and shifts to the process in Step S10 in FIG. 4.

Here, the predetermined value is beneficially set to a minimum amplitude (iin_amp1, iin_amp2) in the case where a phase of each of the power source currents (Iin1, Iin2) and the phase difference between the power source currents can be accurately calculated. In other words, if the amplitudes (iin_amp2, iin_amp1) of the second-high frequency waves of the power source frequency are excessively small, the phase and the phase difference in the following Step S33 cannot be accurately calculated. That is why Step S32 is performed.

In Step S32, if at least one of the amplitudes (iin_amp1, iin_amp2) is larger than the predetermined value (Yes in Step S32), the controller (40) calculates a phase (inn_phase1, inn_phase2) of each of the power source currents (Iin2, Iin1) and a phase difference (inn_phase_err) between the phases (inn_phase_err=iin_phase1−inn_phase2) (Step S33), appropriately using the results of detections by the various detection circuits (31, 32, 33, 36) and the Fourier transformation in Step S31. In particular, in this first embodiment, the controller (40) calculates, as the phase difference (inn_phase_err), how far the power source current (Iin1) according to the above Equation (5) shifts toward the positive side or the negative side using as a reference the power source current (Iin2) according to the above Equation (6) including the differentiation.

Steps S31 to S33 are performed at a timing of the power source zero cross, similar to the adjustment of the gain correction coefficients. For example, in the adjustment of the offset correction coefficient at the timing "A" of the power source zero cross in FIG. 5, the controller (40) obtains the calculation result (that is, the power source current Iin1) of the above Equation (5) in the power source half period section "B" immediately before the timing "A", and the calculation result (that is, the power source current Iin2) of the above Equation (6) in the section B.

Next, the controller (40) determines which of the first detection result or the second detection result (Vac1, Vac1) is the result of the detection dominant for the power source voltage (Vin) in the power source half period immediately before the power source zero cross at the present moment (Step S34). For example, in the adjustment of the offset correction coefficient at the power source zero cross "A" in FIG. 5, the detection result dominant during the power source half period section "B" immediately before the power source zero cross "A" is "Vac2." In this case, the controller (40) determines that the power source half period section "B" immediately before the current power source zero cross "A" at the present moment is dominated in the power source second half section.

In Step S34 of FIG. 7, if the determination result is the first detection result "Vac1" (Yes in Step S34), the controller (40) determines whether the phase difference (inn_phase_err) obtained in Step S33 is a negative value or a positive value, i.e., whether the power source current (Iin1) (the third value) is positive or negative with reference to the power source current (Iin2) (the fourth value) (Step S35).

In Step S35, if the phase difference (inn_phase_err) is a positive value (Yes in Step S35), the controller (40) increases the offset correction coefficient (offset) (Step S36). In contrast, if the phase difference (inn_phase_err) is a negative value (No in Step S35), the controller (40) decreases the offset correction coefficient (offset) (Step S37).

In Step S34, if the determination result is the second determination result "Vac2" (No in Step S34), the controller (40) determines whether the phase difference (inn_phase_err) obtained in step S33 is a positive value or a negative value (step S38), as determined in Step S35.

In Step S38, if the phase difference (inn_phase_err) is a positive value (Yes in Step S38), the controller (40) reduces the offset correction coefficient (offset) (Step S39). In contrast, if the phase difference (inn_phase_err) is a negative value (No in Step S38), the controller (40) increases the offset correction coefficient (offset) (Step S40).

As described above, Steps S35 to S37 focused on the power source first half section and Steps S38 to S40 focused on the power source second half section each provide a quite opposite control for changing the magnitude of the offset correction coefficient (offset) according to the determination whether the phase difference (inn_phase_err) is a positive value or a negative value (i.e., a magnitude relationship of the phase (inn_phase1, inn_phase2)).

In Steps S36, S37, S39 and S40, the adjustment width of the offset correction coefficient (offset) is beneficially determined in accordance with the phase difference (inn_phase_err) so that the phase difference (inn_phase_err) converges to 0, i.e., the phase (inn_phase1) of the power source current (Iin1) which is the third value substantially matches the phase (inn_phase2) of the power source current (Iin2) which is the fourth value.

After Steps S36, S37, S39, and S40, the process of the controller (40) proceeds to that in Step S21 of FIG. 4.

Although not shown in FIG. 7, after Steps S36, S37, S39, and S40, the controller (40) may recalculate the phase (inn_phase1) of the power source current (Iin1) based on the adjusted offset correction coefficient (offset), and compare the phase (inn_phase 1) of the power source current (Iin1) with the phase (inn_phase2) of the power source current (Iin2) as a reference, thereby confirming that the phase difference (inn_phase_err) has converged to approximately 0.

Next, a process of adjusting the offset correction coefficient (offset) described above will be briefly described with reference to FIGS. 8 to 10.

Figure 8:
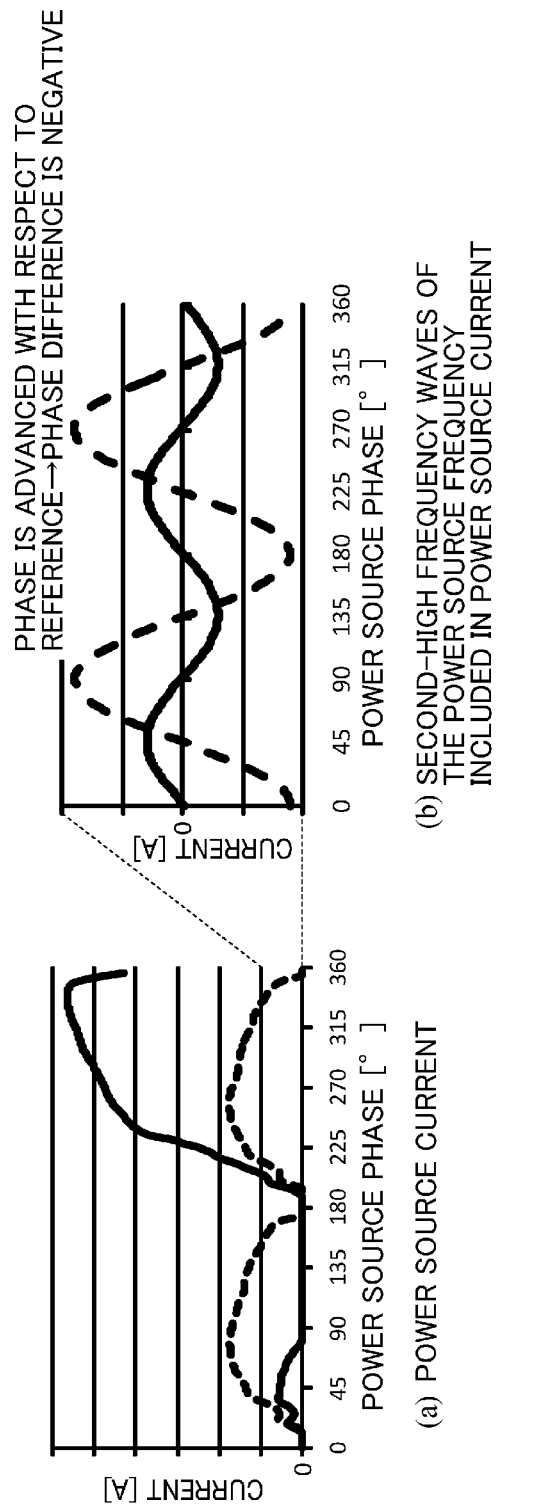
FIG. 8 illustrates graphs for explaining the process of offset correction, and illustrating a state before the gain correction and the offset correction are started.

FIG. 8 shows in an illustration (a) the power source current (Iin2) according to the Equation (6) serving as a reference and the power source current (Iin1) according to the Equation (5), before the offset correction coefficient (offset) is adjusted. FIG. 8 shows in an illustration (b) the power source currents (Iin1, Iin2) of the illustration (a) in FIG. 8 represented in second-high frequency waves of the power source frequency. In the state of the illustrations (a) and (b) in FIG. 8, neither the gain correction nor the offset correction is performed yet. In particular, the illustration (a) of FIG. 8 shows that, in the power source first half section, the power source current (Iin1) is lower as a whole with respect to the power source current (Iin2) serving as a reference, and in the power source second half section, the power source current (Iin1) is higher as a whole with respect to the power source current (Iin2) serving as a reference. From the illustration (b) of FIG. 8, the phase (inn_phase1) of the power source current (Iin1) is advanced with respect to the reference power source current (Iin2) serving as a reference, and with reference to the phase (inn_phase2) of the power source current (Iin2), the phase difference (inn_phase_err) between the power source currents (Iin1, Iin2) appears to be a negative value.

Figure 9:
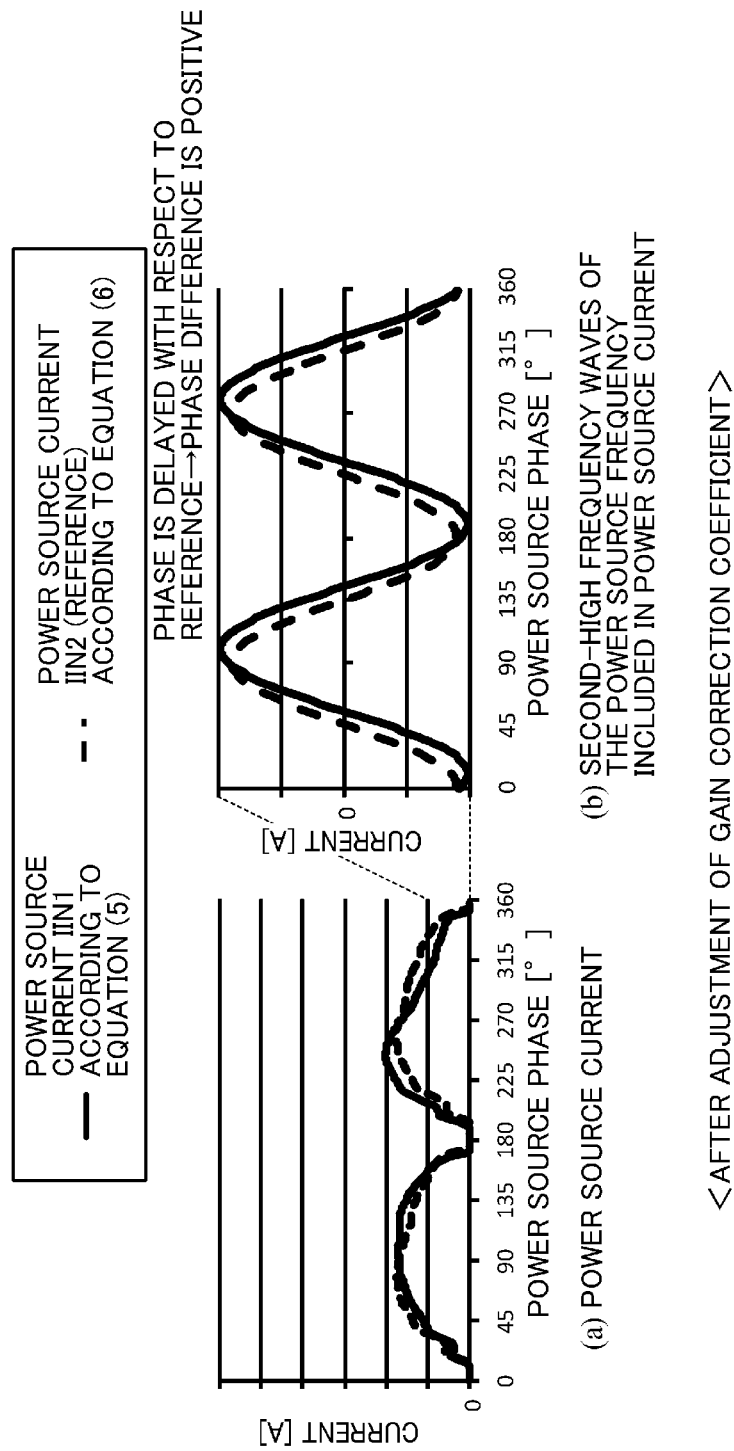
FIG. 9 illustrates graphs exemplifying a state in FIG. 8 after the gains are corrected in accordance with FIG. 4.

FIG. 9 shows a state in which only the adjustments of the gain correction coefficients (G1, G2) are performed in advance from the state of FIG. 8 in accordance with FIG. 4. Specifically, the illustration (a) of FIG. 9 shows the power source current (Iin2) according to the Equation (6) serving as a reference and the power source current (Iin1) according to the Equation (5), after only the adjustments of the gain correction coefficients (G1, G2) are performed. FIG. 9 shows in the illustration (b) the power source currents (Iin1, Iin2) of the illustration (a) in FIG. 9 represented in second-high frequency waves of the power source frequency. For the power source first half section, FIG. 9 shows that the gain correction coefficient (G1) is adjusted in Step S15 of FIG. 4 to be able to absorb the variation of the first voltage detection unit (34). For the power source second half section, FIG. 9 shows that the gain correction coefficient (G2) is adjusted in Step S17 of FIG. 4 to be able to absorb the variation of the second voltage detection unit (35). Thus, from the power source first half section to the power source second half section, the magnitude of the recalculated power source current (Iin1) approximately matches the magnitude of the power source current (Iin2) serving as a reference.

However, in FIG. 9, the offset correction coefficient (offset) has not been adjusted yet. Therefore, as is apparent from the illustration (b) of FIG. 9, the phases (inn_phase1 and inn_phase2) of the power source currents (Iin1 and Iin2) do not match each other.

Note that, in the illustration (b) of FIG. 8 before the adjustments of the gain correction coefficients (G1, G2), the phase (inn_phase1) of the power source current (Iin1) appears to be advanced with respect to the power source current (Iin2). However, in the illustration (b) of FIG. 9 after the adjustments of the gain correction coefficients (G1, G2), the phase (inn_phase1) of the power source current (Iin1) is not advanced but rather delayed with respect to the power source current (Iin2). In the illustration (b) of FIG. 9, with the phase (inn_phase2) of the power source current (Iin2) as a reference, the phase difference (inn_phase_err) between the power source currents (Iin1, Iin2) is a positive value rather than a negative value. This indicates that the state of the original phase (inn_phase1) of the power source current (Iin1) becomes clear because the gain correction is performed before the offset correction. As described above, the gain correction performed before the offset correction is beneficial in that the offset correction coefficient (offset) can be easily adjusted.

Figure 10:
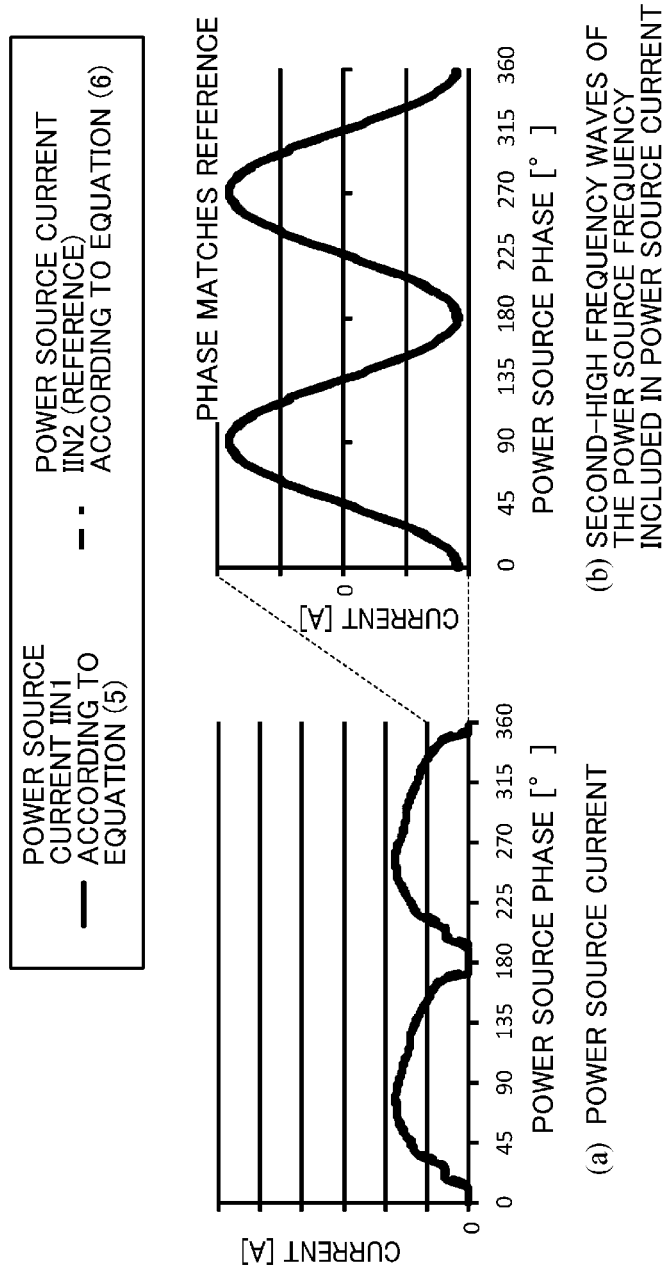
FIG. 10 illustrates graphs exemplifying a state in FIG. 9 after the offsets are further corrected in accordance with FIG. 7.

FIG. 10 shows a state after the adjustment of the offset correction coefficient (offset) has been performed, from the state shown in FIG. 9, in accordance with FIG. 7. Specifically, FIG. 10 shows in an illustration (a) the power source current (Iin2) according to the Equation (6) serving as a reference and the power source current (Iin1) according to the Equation (5), after the offset correction coefficient (offset) is adjusted. FIG. 10 shows in the illustration (b) the power source currents (Iin1, Iin2) of the illustration (a) in FIG. 10 represented in second-high frequency waves of the power source frequency. As described in the illustration (b) of FIG. 9, the phase difference (inn_phase_err) between the power source currents (Iin1, Iin2) is a positive value. Hence, the offset correction coefficient (offset) is adjusted in accordance with Step S36 or Step S39 in FIG. 7 to be able to absorb the variation of the first and second voltage detection units (34, 35). Therefore, in FIG. 10, not only the current values of the power source current (Iin1) according to the recalculated Equation (5) and the power source current (Iin1) according to the reference Equation (6) serving as a reference, but also the phases (inn_phase1 and inn_phase2) of the power source currents (Iin1 and Iin2) substantially match each other from the power source first half section to the power source second half section.

Therefore, in FIG. 10, it can be said that the possibility that an individual difference in the offset of the voltage detection circuit (33) including the first and second voltage detection units (34, 35) influences the estimation of the power source current (Iin1) is reduced.

<Advantages>

In the first embodiment, the voltages (Vac1, Vac2) correlating with the power source voltage (Vin) are detected by the voltage detection circuit (33). However, the first and second detection results (Vac1, Vac2) are not used as they are for estimation of the power source current. The first and second detection results (Vac1, Vac2) receive gain correction, and based on the gain correction, the across voltage (VL) of the reactor (29) is calculated. Then, the first and second detection results (Vac1, Vac2) are used for the estimation of the power source current (Iin). In particular, the gains are corrected so that a value correlating with an average value per predetermined time period of the estimated power source current (Iin) matches a value correlating with an average value per predetermined time period of the current (Iinv) flowing toward the inverter (27) (i.e., the current downstream of the capacitor (26)). Thus, this first embodiment can accurately calculate the power source current (Iin) using the voltage detection circuit (33) having a relatively simple configuration without using a current sensor or a current detection circuit.

In addition, in the first embodiment, the capacitor (26) has a relatively small capacity so as to absorb voltage fluctuations caused by switching of the inverter circuit (27) without absorbing voltage fluctuations from the converter circuit (21). Therefore, since the capacitor (26) cannot smooth the ripple voltage caused by the power source frequency of the AC power source (91) and is likely to generate the harmonics of the power source, the inverter circuit (27) has to be controlled using the power source current so that the harmonics of the power source is minimized. On the other hand, as described above, the first embodiment estimates the power source current (Iin) with high accuracy. Therefore, the inverter circuit (27) is controlled more accurately to reduce the harmonics of the power source.

Furthermore, in the first embodiment, as shown in the above Equation (4), the controller (40) further obtains the across voltage (VL) of the reactor (29) based on the voltage drop (VR) of the reactor (29). Thus, the across voltage (VL) of the reactor (29) can be obtained more accurately.

Furthermore, in the first embodiment, as shown in the above Equation (4), the controller (40) further obtains the across voltage (VL) of the reactor (29) based on a voltage drop (Vdb) generated in the diodes (D1 to D4). Thus, the across voltage (VL) of the reactor (29) can be obtained more accurately.

In addition, in the first embodiment, the controller (40) corrects the gains each for one of the first detection result (Vac1) of the first voltage detection unit (34) and of the second detection result (Vac2) of the second voltage detection unit (35) so that the value correlating with the average value per predetermined time period of the estimated power source current (Iin) matches the value correlating with the average value of the current (Iinv), per predetermined time period, flowing toward the inverter (27), and obtains the across voltage (VL) of the reactor (29) based on a difference between the first detection result (Vac1) with the gain corrected and the second detection result (Vac2) with the gain corrected. This can obtain the across voltage (VL), of the highly accurate reactor (29), with the influence of the carrier noise canceled.

Furthermore, in the first embodiment, the controller (40) corrects the gains of the first and second detection results (Vac1, Vac1) of the voltage detection circuit (33) so that, when the first value related to the integrated value of the across voltage (VL) of the reactor (29) and the second value related to the derivative value of the across voltage (Vdc) of the capacitor (26) match each other, the value correlating with the average value per predetermined time period of the estimated power source current (Iin) matches the value correlating with the average value per predetermined time period of the current (Iinv) flowing toward the inverter (27) side. Thus, the gain correction of the first and second detection results (Vac1, Vac2) is performed with high accuracy.

Note that the predetermined time period is set to a half period of the AC power source (91).

In addition, in the first embodiment, the controller (40) corrects the offset of the detection results (Vac1, Vac2) of the voltage detection circuit (33) so that the phase of the power source current (Iin1) based on the integrated value of the across voltage (VL) of the reactor (29) matches the phase of the power source current (Iin2) based on the derivative value of the across voltage (Vdc) of the capacitor (26). Thus, the offset correction of the first and second detection results (Vac1, Vac2) is performed with high accuracy. Furthermore, since the across voltage (VL) of the reactor (29) can be obtained with higher accuracy based on the first and second detection results (Vac1, Vac2) with not only the gain but also the offset corrected, the power source current (Iin) estimated based on the across voltage (VL) can be closer to the actual value.

In addition, in the first embodiment, the controller (40) calculates the amplitude (inn_amp1, inn_amp2) of each power source current (Iin1, Iin2) with predetermined-high frequency waves of the power source frequency, and determines that the phase of each power source current (Iin1, Iin2) can be accurately calculated only when the amplitude (inn_amp1, inn_amp2) is larger than a predetermined value, and corrects the offsets of the first and second detection results (Vac1, Vac2). Such features make it possible to reduce deterioration in accuracy when the offsets are corrected.

In addition, in the first embodiment, the controller (40) corrects the gains of the first and the second detection results (Vac1, Vac2), and then corrects the offsets of the first and second detection results (Vac1, Vac2). Thus, offsets can be easily corrected in the offset correction.

<Modification According to Adjustment of Offset Correction Coefficient (Offset)>

The offset correction coefficient (offset) may be adjusted in a manner other than the method according to FIG. 7.

Note that, in the following first and second modifications, only the method of adjusting the offset correction coefficient (offset) is different from that described above, and the circuit configurations of the power converter (1) and the current estimating device (10) and the gain correction (the adjustment of the gain correction coefficients G1 and G2) are the same as described above.

—First Modification—

In the first modification, the controller (40) obtains a shift in offset from the original design value from each of the detection results (Vac1, Vac2) of the voltage detection circuit (33), and sets the shift as an offset correction coefficient (offset).

Figure 11:
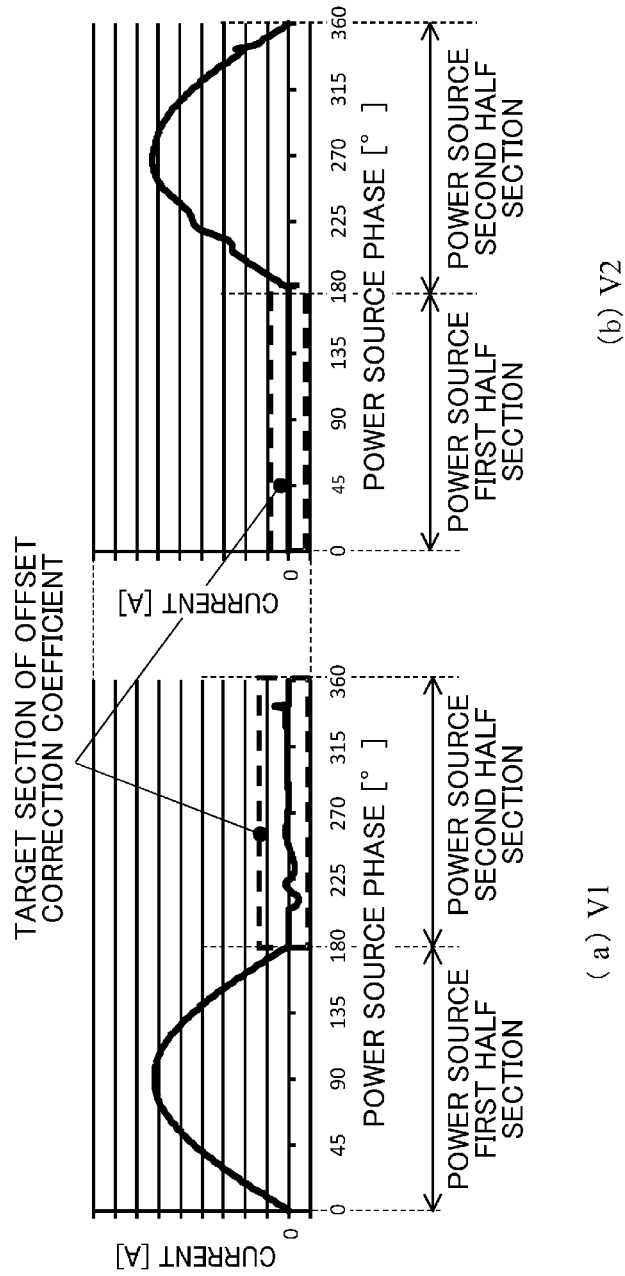
FIG. 11 illustrates graphs for explaining how to correct offsets according to a first modification.

FIG. 11 shows the positive side voltage (V1) and the negative side voltage (V2) respectively corresponding to the detection result (Vac1) and the detection result (Vac2) of the voltage detection circuit (33). As described above, the positive side voltage (V1) is dominant in the power source first half section of the power source voltage (Vin), but is not dominant in the power source second half section of the power source voltage (Vin). Therefore, the design voltage value of the positive side voltage (V1) should be constant at a voltage of approximately "0 V" in the power source second half section. Furthermore, the negative side voltage (V2) is dominant in the power source second half section of the power source voltage (Vin), but is not dominant in the power source first half section of the power source voltage (Vin). Therefore, the design voltage value of the negative side voltage (V2) should be constant at a voltage of approximately "0 V" in the power source first half section. However, the actual voltage value is not constant at "0 V" in the power source second half section of the positive side voltage (V1) and the power source first half section of the negative side voltage (V2) because the actual offset value shifts from the original design value of the offset due to the variation of the components of the voltage detection circuit (33) (the individual difference and the temperature characteristics).

Thus, the controller (40) according to the first modification detects an offset of the first voltage detection unit (34) in the voltage detection circuit (33) by calculating an average value during the power source second half section (specifically, a section in which the power source phase (θin) is 180 degrees to 360 degrees) with respect to the first detection result (Vac1) of the voltage detection circuit (33). The controller (40) detects an offset of the second voltage detection unit (35) in the voltage detection circuit (33) by calculating an average value during the power source first half section (specifically, a section in which the power source phase (θin) is 0 degree to 180 degrees) with respect to the second detection result (Vac2). Then, the controller (40) determines the difference between the offset of the first voltage detection unit (34) and the offset of the second voltage detection unit (35) as an offset correction coefficient (offset). In other words, in this method, an offset correction coefficient (offset) is obtained using both the first detection result (Vac1) and the second detection result (Vac2) of the voltage detection circuit (33).

Note that the controller (40) may obtain the offset correction coefficient (offset), using only one of the first detection result (Vac1) or the second detection result (Vac2) of the voltage detection circuit (33). Furthermore, the controller (40) may obtain an average value of the power source second half section of the first detection result (Vac1) and the power source first half section of the second detection result (Vac2).

In addition, the controller (40) may use the following method instead of using the difference between the offset of the first voltage detection unit (34) and the offset of the second voltage detection unit (35) as an offset correction coefficient (offset). The controller (40) detects an accurate first detection result (Vac1) by correcting the first detection result (Vac1) using the offset of the first voltage detection unit (34). Furthermore, the controller (40) detects an accurate second detection result (Vac2) by correcting the second detection result (Vac2) using the offset of the second voltage detection unit (35). In this case, the controller (40) can calculate an accurate power source voltage (Vin), using the difference between the accurate detection results (Vac1, Vac2), i.e., the accurate detection results (Vac1, Vac2) as the respective first and second terms of the right side of the Equation (3).

As described above, since the average value of the detection results (Vac1, Vac2) in the section in which the detection results (Vac1, Vac2) are not dominant corresponds to the shift of the offset, the first modification can easily obtain the offset correction coefficient (offset) which is the shift of the offsets. Furthermore, the current estimating device (10) can obtain the across voltage (VL) of the reactor (29) with higher accuracy using the detection results (Vac1, Vac2), of the voltage detection circuit (33), with the offsets corrected.

—Second Modification—

In the second modification, the controller (40) calculates the power source voltage (Vin) based on the detection results (Vac1, Vac2) of the voltage detection circuit (33), obtains the shift of the offset from the original design value based on the calculation result (power source voltage (Vin) by the calculation), and sets the shift as the offset correction coefficient (offset).

Specifically, the controller (40) applies the detection results (Vac1, Vac2) of the voltage detection circuit (33) to the above Equation (3), and calculates the power source voltage (Vin). The second modification, as in the first embodiment, exemplifies that the offset correction coefficient (offset) is adjusted after the gain correction coefficients (G1, G2) are adjusted (FIGS. 4 and 7), and it is assumed in the above Equation (3) that only the gain correction coefficients (G1, G2) have been adjusted.

Furthermore, the controller (40) obtains the timing of the power source zero cross of the AC power source (91) based on the power source phase (θin) of the AC power source (91) of the power source phase detection circuit (31).

Figure 12:
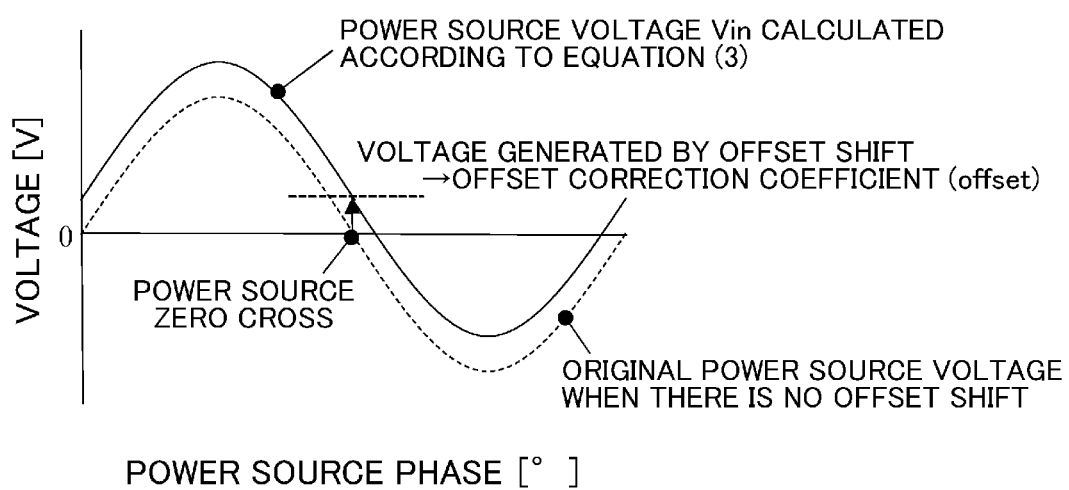
FIG. 12 is a graph for explaining how to correct offsets according to a second modification.

Then, as shown in FIG. 12, the controller (40) obtains the voltage value of the power source voltage (Vin) obtained through calculation near the power source zero cross of the AC power source (91), and adjusts the offset correction coefficient (offset) based on the obtained voltage value. Specifically, when the voltage value of the power source voltage (Vin) near the power source zero cross is positive, the controller (40) reduces the offset correction coefficient (offset), and when the voltage value of the power source voltage (Vin) near the power source zero cross is negative, the controller (40) adjusts to increase the offset correction coefficient (offset).

Note that the controller (40) corrects the offsets of the first detection result (Vac1) and the second detection result (Vac2) of the voltage detection circuit (33) using the obtained offset correction coefficient (offset).

Thus, the voltage value of the power source voltage (Vin) near the zero cross of the AC power source (91) corresponds to the shift of the offset. As described above, the second modification makes it possible to easily obtain the shift of the offset as the offset correction coefficient (offset). Furthermore, using the detection results (Vac1, Vac2), of the voltage detection circuit (33), with the offsets corrected, the current estimating device (10) can obtain the across voltage (VL) of the reactor (29) with higher accuracy.

Note that the above procedure may be repeated until the voltage value near the power source zero cross of the recalculated power source voltage (Vin) converges to 0 by the offset correction coefficient (offset). In adjusting the offset correction coefficient (offset), the controller (40) may subtract the magnitude of the voltage value of the power source voltage (Vin) near the power source zero cross from the offset design value, and set the subtraction result as an offset correction coefficient (offset).

Second Embodiment

A second embodiment exemplifies a case where the circuit configurations of the power converter (1) and the current estimating device (10) are different from those in the first embodiment. The second embodiment shown in FIG. 13 is different in the position of the reactor (29) and the position of detection by the voltage detection circuit (33) from the above first embodiment shown in FIG. 1.

Figure 13:
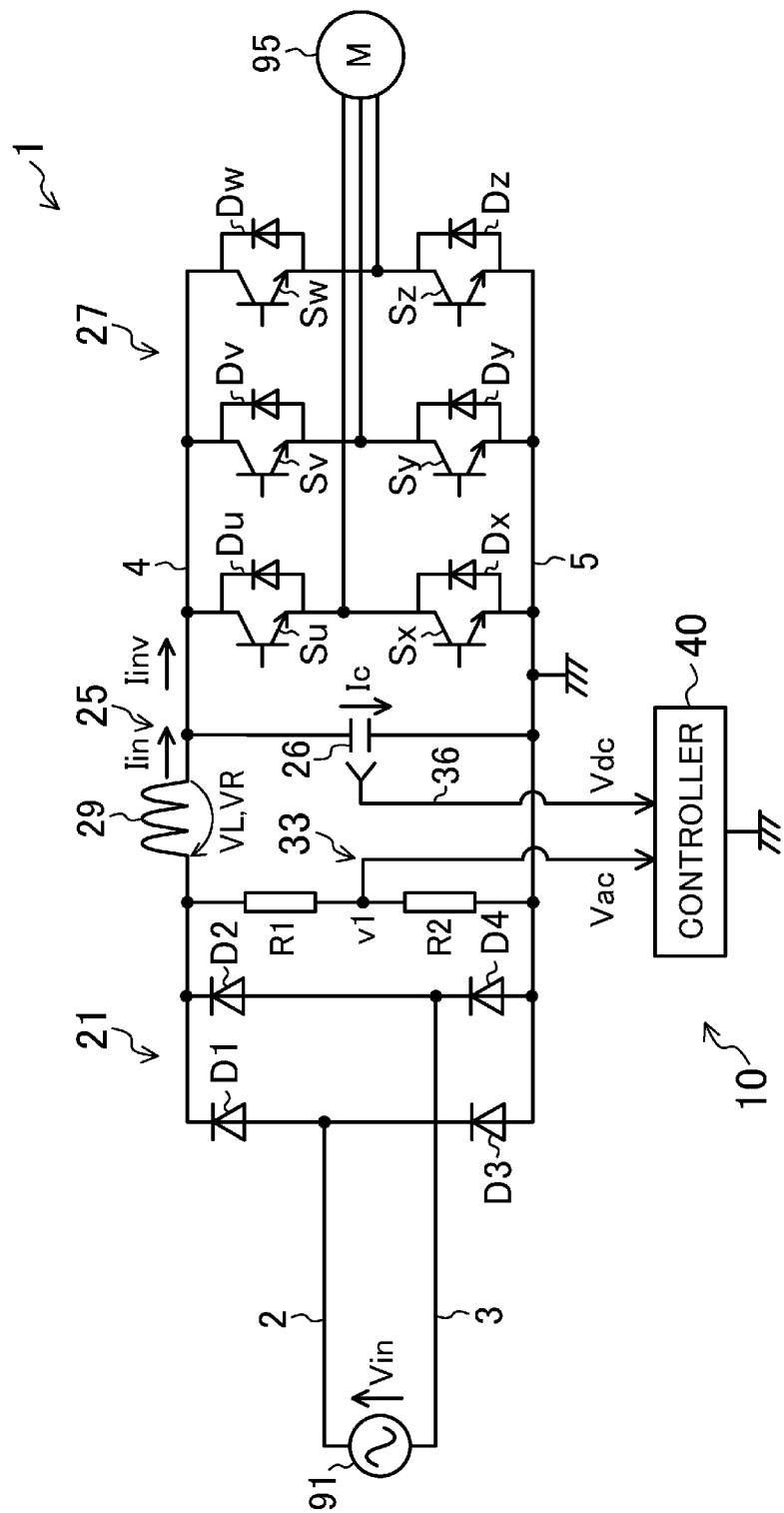
FIG. 13 is a schematic configuration diagram of a power converter and a current estimating device according to a second embodiment.

For convenience of explanation, in FIG. 13, the same reference numerals in FIG. 1 denote the same components as those in FIG. 1.

The reactor (29) is connected to the power source wiring (4) between the converter circuit (21) and the capacitor (26) of the DC link unit (25). That is, it can be said that the reactor (29) according to second embodiment is located not on the AC side but on the DC side.

A voltage detection circuit (33) is provided at an input side of the reactor (29) between the converter circuit (21) and the capacitor (26) of the DC link unit (25). The voltage detection circuit (33) is a voltage divider circuit including a plurality of resistances (two in this case), and detects a voltage to be applied to the reactor (29) as a voltage (Vac) which correlates with a power source voltage (Vin) of the AC power source (91). That is, it can be said that the detection position of the voltage detection circuit (33) according to the second embodiment is not on the AC side but on the DC side.

Note that FIG. 13 exemplifies a case in which the power source phase detection circuit (31) and the power source frequency detection circuit (32) are not provided. Alternatively, the power source phase detection circuit (31) and the power source frequency detection circuit (32) may be provided.

The circuit configuration other than the reactor (29) and the voltage detection circuit (33) is the same as that in the first embodiment, and therefore, a description thereof will be omitted.

In addition, in estimating the power source current (Iin), the Equations (3) to (6) are basically used. However, since there is only one detection result of the voltage detection circuit (33), one of the above Equations (1) and (2) becomes unnecessary.

Furthermore, as shown by the record corresponding to "the circuit pattern No. 2" of FIG. 17, in the circuit configuration of FIG. 13, the correction for the voltage drop (2Vdb) of the diodes (D1, D4) in the converter circuit (21) described in the first embodiment, and the adjustment (the offset correction) of the offset correction coefficient (offset) become unnecessary. The reason why the correction for the voltage drop (2Vdb) of the diodes (D1, D4) is not necessary is that the detection position of the voltage detection circuit (33) is on the DC side, and the reason why the adjustment of the offset correction coefficient (offset) is not necessary is that the position of the reactor (29) is on the DC side. In the circuit configuration of FIG. 13, the correction for the voltage drop (VR) in the reactor (29) and the adjustment of the gain correction coefficients (G1, G2) (the gain correction) are performed in the same manner as those described in the first embodiment.

Third Embodiment

A third embodiment exemplifies a case where the circuit configurations of the power converter (1) and the current estimating device (10) are different from those in the first embodiment. The third embodiment shown in FIG. 14 is different in the position of the reactor (29) and the circuit configuration of the voltage detection circuit (33) from the above first embodiment shown in FIG. 1.

Figure 14:
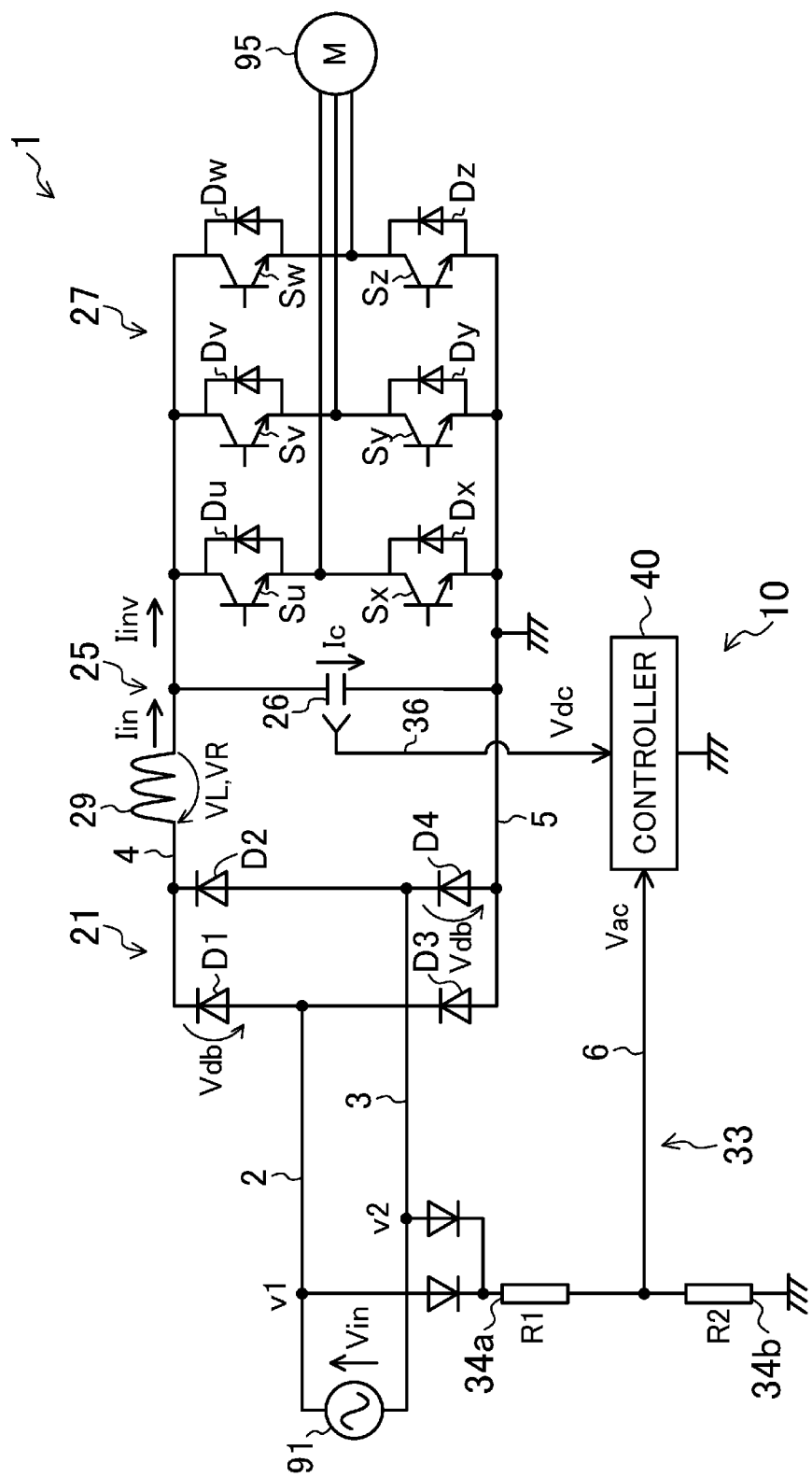
FIG. 14 is a schematic configuration diagram of a power converter and a current estimating device according to a third embodiment.

For convenience of explanation, in FIG. 14, the same reference numerals in FIG. 1 denote the same components as those in FIG. 1.

The reactor (29) is connected to the power source wiring (4) between the converter circuit (21) and the capacitor (26) of the DC link unit (25). That is, it can be said that the reactor (29) according to the third embodiment is located not on the AC side but on the DC side.

The voltage detection circuit (33) is connected to the wiring (2) and the wiring (3) between the AC power source (91) and the converter circuit (21). In other words, it can be said that the detection position of the voltage detection circuit (33) according to the third embodiment is on the AC side as in FIG. 1. The voltage detection circuit (33) is a voltage divider circuit including a plurality of resistances (two in this case). Specifically, the voltage detection circuit (33) has a circuit configuration in which the positive side voltage (V1) and the negative side voltage (V2) of the AC power source (91) are applied through respective diodes to the two resistances connected in series.

Note that FIG. 14 exemplifies a case in which the power source phase detection circuit (31) and the power source frequency detection circuit (32) are not provided. Alternatively, the power source phase detection circuit (31) and the power source frequency detection circuit (32) may be provided.

The circuit configuration other than the reactor (29) and the voltage detection circuit (33) is the same as that in the first embodiment, and therefore, a description thereof will be omitted.

In addition, in estimating the power source current (Iin), the Equations (3) to (6) are basically used. However, since there is only one detection result of the voltage detection circuit (33), one of the above Equations (1) and (2) becomes unnecessary.

Furthermore, as shown by the record corresponding to "the circuit pattern No. 3" of FIG. 17, in the circuit configuration of FIG. 14, only the adjustment (the offset correction) of the offset correction coefficient (offset) becomes unnecessary. The reason why the adjustment of the offset correction coefficient (offset) is not necessary is that the position of the reactor (29) is on the DC side. In the circuit configuration of FIG. 14, the correction for the voltage drop (2Vdb) of the diodes (D1, D4) in the converter circuit (21), the correction for the voltage drop (VR) in the reactor (29), and the adjustment (the gain correction) of the gain correction coefficients (G1, G2) are performed in the same manner as those in the first embodiment. The reason why the correction for the voltage drop (2vdb) of the diodes (D1, D4) is performed is that the detection position of the voltage detection circuit (33) is on the AC side.

Fourth Embodiment

A fourth embodiment exemplifies a case where the circuit configurations of the power converter (1) and the current estimating device (10) are different from those in the first embodiment. The fourth embodiment shown in FIG. 15 is different only in the circuit configuration of the voltage detection circuit (33) from the above first embodiment shown in FIG. 1.

Figure 15:
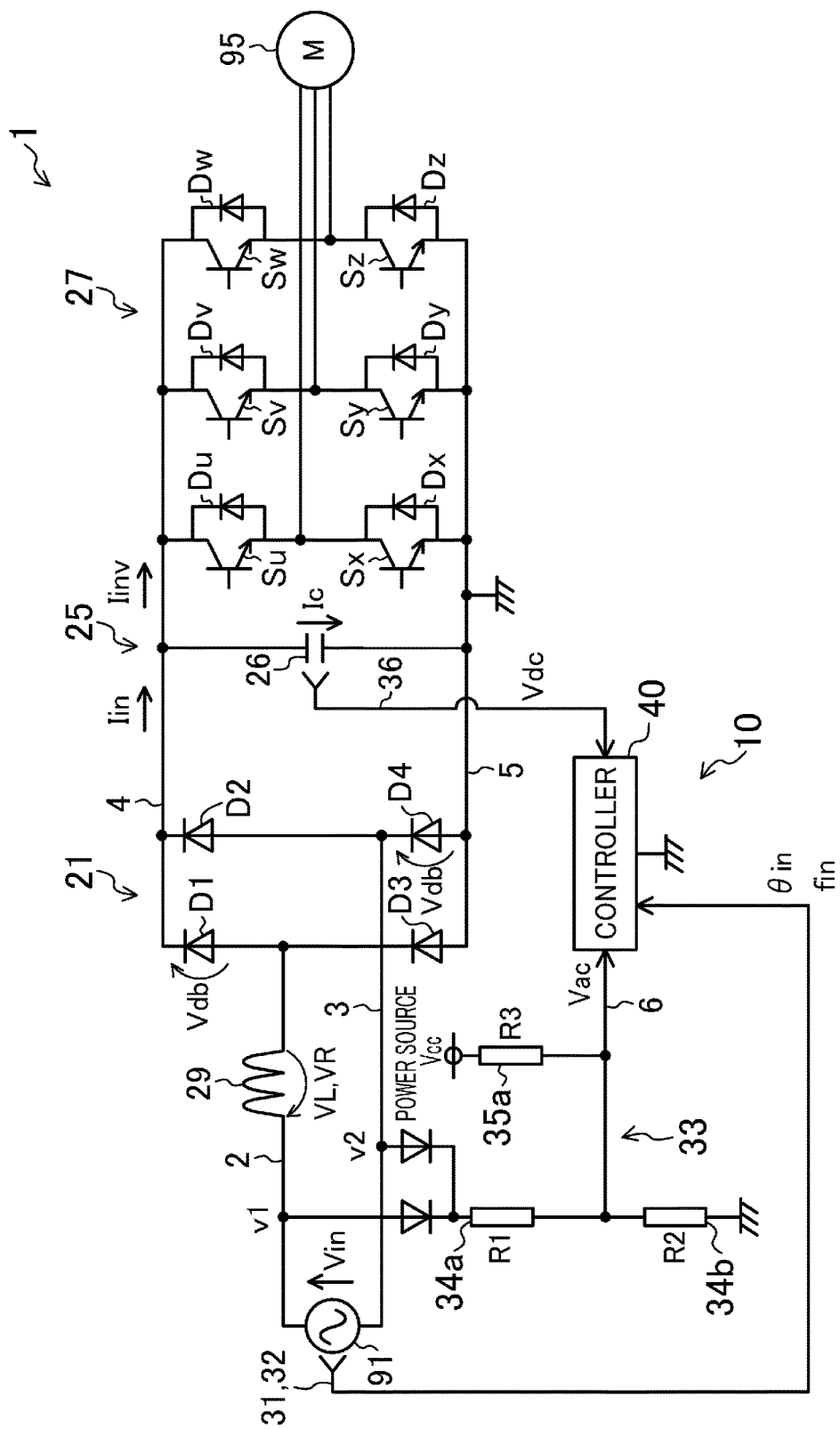
FIG. 15 is a schematic configuration diagram of a power converter and a current estimating device according to a fourth embodiment.

For convenience of explanation, in FIG. 15, the same reference numerals in FIG. 1 denote the same components as those in FIG. 1.

The voltage detection circuit (33) is connected to the wiring (2) and the wiring (3) between the AC power source (91) and the converter circuit (21). In other words, it can be said that the detection position of the voltage detection circuit (33) according to the fourth embodiment is on the AC side as in FIG. 1. The voltage detection circuit (33) is a voltage divider circuit including a plurality of resistances (two in this case). Specifically, the voltage detection circuit (33) has a circuit configuration in which the positive side voltage (V1) and the negative side voltage (V2) of the AC power source (91) are applied through respective diodes to the two resistances connected in series. Furthermore, the connection node of the 2 resistances is connected to the controller (40) via the wiring (6). Another resistance is connected between the wiring (6) and the power source.

The circuit configuration other than the voltage detection circuit (33) is the same as that in the first embodiment, and therefore, a description thereof will be omitted.

In addition, in estimating the power source current (Iin), the Equations (3) to (6) are basically used. However, since there is only one detection result of the voltage detection circuit (33), one of the above Equations (1) and (2) becomes unnecessary.

Furthermore, as shown by the record corresponding to "a circuit pattern No. 4" of FIG. 17, in the circuit configuration of FIG. 15, all of the correction for the voltage drop (2Vdb) of the diodes (D1, D4) in the converter circuit (21), the correction for the voltage drop (VR) in the reactor (29), the adjustment (the gain correction) of the gain correction coefficients (G1, G2), and the adjustment (the offset correction) of the offset correction coefficient (offset) are performed in the same manner as those in the first embodiment. The reason why the correction for the voltage drop (2Vdb) of the diodes (D1, D4) is performed is because the detection position of the voltage detection circuit (33) is on the AC side, and the reason why the adjustment of the offset correction coefficient (offset) is performed is because the position of the reactor (29) is on the AC side.

Fifth Embodiment

A fifth embodiment exemplifies a case where the circuit configurations of the power converter (1) and the current estimating device (10) are different from those in the first embodiment. The fifth embodiment shown in FIG. 16 is different only in the position of the reactor (29) from the above first embodiment shown in FIG. 1.

Figure 16:
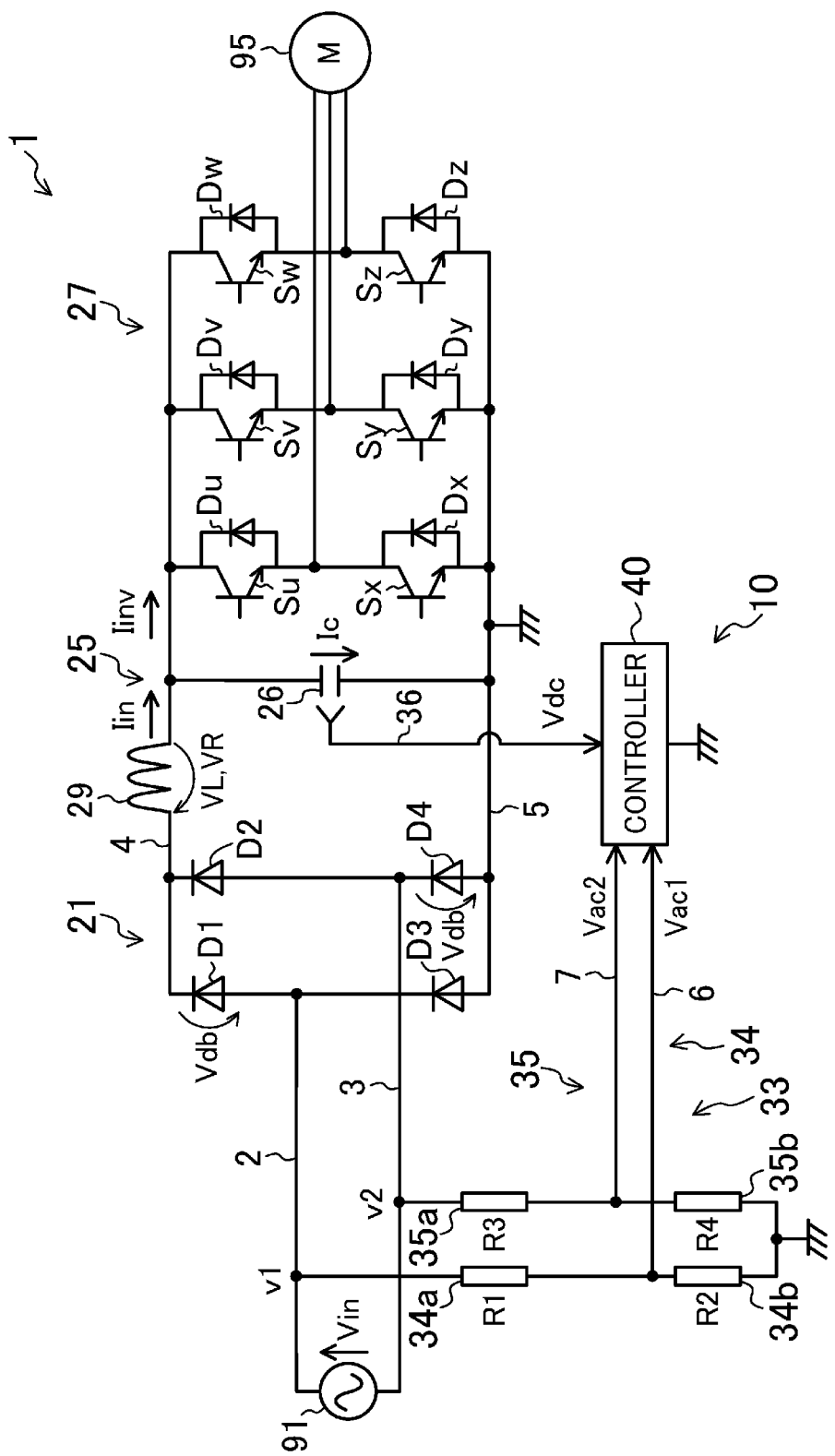
FIG. 16 is a schematic configuration diagram of a power converter and a current estimating device according to a fifth embodiment.

For convenience of explanation, in FIG. 16, the same reference numerals in FIG. 1 denote the same components as those in FIG. 1.

The reactor (29) is connected to the power source wiring (4) between the converter circuit (21) and the capacitor (26) of the DC link unit (25). That is, it can be said that the reactor (29) according to the fifth embodiment is located not on the AC side but on the DC side.

Note that FIG. 16 exemplifies a case in which the power source phase detection circuit (31) and the power source frequency detection circuit (32) are not provided. Alternatively, the power source phase detection circuit (31) and the power source frequency detection circuit (32) may be provided.

The circuit configuration other than the reactor (29) is the same as that in the first embodiment, and therefore, a description thereof will be omitted.

In addition, in estimating the power source current (Iin), the Equations (3) to (6) are basically used.

Furthermore, as shown by the record corresponding to "the circuit pattern No. 5" of FIG. 17, only the adjustment (the offset correction) of the offset correction coefficient (offset) described in the above first embodiment becomes unnecessary since the reactor (29) is located on the DC side in the circuit configuration of FIG. 16. In the circuit configuration of FIG. 16, the correction for the voltage drop (2Vdb) of the diodes (D1, D4) in the converter circuit (21), the correction for the voltage drop (VR) in the reactor (29), and the adjustment (the gain correction) of the gain correction coefficients (G1, G2) are performed in the same manner as those in the first embodiment. The reason why the correction for the voltage drop (2vdb) of the diodes (D1, D4) is performed is that the detection position of the voltage detection circuit (33) is on the AC side as in FIG. 1.

Other Embodiments

In FIG. 7 showing the flow of the adjustment of the offset correction coefficient (offset), Step S32 is not essential. That is to say, regardless of the magnitude of the amplitudes (inn_amp2, inn_amp1) of the second-high frequency waves of the power source frequency and a predetermined value, the processing to proceed to Step S33 may be executed.

Furthermore, the amplitudes (inn_amp1, inn_amp2) may be calculated with predetermined-high frequency waves of the power source frequency. The amplitudes do not have to be limited to second-high frequency waves of the power source frequency.

In the flow of FIGS. 4 and 7, the gain correction coefficient (G1, G2) are adjusted, and then, the offset correction coefficient (offset) is adjusted. However, the adjustments do not have to be performed in this order. The adjustment of the gain correction coefficients (G1, G2) and the adjustment of the offset correction coefficient offset may be simultaneously performed.

Although the adjustment of the gain correction coefficients (G1, G2) is essential, the detail of the adjustment does not have to be limited to that described in the first embodiment. As long as the gain correction coefficients (G1, G2) are appropriately adjusted, the specific details of the adjustment may be slightly different from those described in the first embodiment.

In addition, among the adjustment of the offset correction coefficient (offset), the correction for the voltage drop (VR) of the reactor (29), and the correction for the voltage drop (2Vdb) in the diodes (D1 to D4), at least one of the processes does not have to be performed.

The controller (40) performs the processes shown in FIGS. 3, 4, and 7 and also performs the inverter control. The controller (40) may perform only the processes shown in FIGS. 3, 4, and 7. In this case, a controller for controlling the inverter is provided separately from the controller (40).

FIGS. 1 and 15 exemplify the cases in which each of the power source phase (θin) of the AC power source (91) and the frequency (fin) of the power source voltage (Vin) is detected with hardware by the detection circuits (31, 32). However, the power source phase (θin) of the AC power source (91) and the frequency (fin) of the power source voltage (Vin) do not have to be detected by the detection circuits (31, 32). Instead, the power source phase (θin) of the AC power source (91) and the frequency (fin) of the power source voltage (Vin) may be calculated and estimated based on the power source voltage (Vin) calculated according to the above Equation (3). Specifically, the power source phase (θin) of the AC power source (91) and the frequency (fin) of the power source voltage (Vin) may be obtained with software. For example, the controller (40) generates, as a zero cross signal, a signal to be (i) LOW when the calculated power source voltage (Vin) is lower than or equal to a threshold value (e.g., 0 V), and (ii) HIGH when the calculated power source voltage (Vin) is higher than the threshold value. Because of this zero cross signal, the controller (40) can calculate the power source phase (θin) of the AC power source (91) and the frequency (fin) of the power source voltage (Vin).

The capacitor (26) does not have to be of a relatively small capacity so as to absorb voltage fluctuations due to switching of the inverter circuit (27) without absorbing voltage fluctuations from the converter circuit (21).

The estimated power source current (Iin1) may be used not only for the control of the inverter circuit (27) but also for a wide range of controls of the power converter (1), such as a control of the converter circuit (21).

INDUSTRIAL APPLICABILITY

As described above, the present invention is useful for a device which accurately calculates a power source current (Iin) using a voltage detection circuit (33) having a simple configuration without using a current sensor or a current detection circuit.

DESCRIPTION OF REFERENCE CHARACTERS

1 Power Converter
10 Current Estimating Device
29 Reactor
21 Converter Circuit (Rectifying Circuit)
26 Capacitor
27 Inverter Circuit
33 Voltage Detection Circuit
34 First Voltage Detection Unit
35 Second Voltage Detection Unit
40 Controller (Calculation Unit)
91 AC Power Source

The invention claimed is:

1. A current estimating device included in a power converter and estimating a power source current which is a current upstream of a capacitor, the power converter including: a rectifying circuit rectifying an AC power output from an AC power source; an inverter circuit supplied with power from the rectifying circuit; the capacitor connected between the rectifying circuit and the inverter circuit in parallel with the rectifying circuit; and a reactor connected between the AC power source and the capacitor, the current estimating device comprising:

a voltage detection circuit which is a voltage divider circuit including a plurality of resistances, the voltage detection circuit detecting voltages correlating with a power source voltage of the AC power source; and a calculation unit obtaining an across voltage of the reactor based on detection results detected by the voltage detection circuit, and estimating the power source current based on the across voltage, wherein the calculation unit:

corrects gains of the detection results of the voltage detection circuit so that a value correlating with an average value per predetermined time period of the estimated power source current matches a value correlating with an average value per the predetermined time period of a current downstream of the capacitor; and obtains the across voltage of the reactor based on the detection results, of the voltage detection circuit, with the gains corrected.

2. The current estimating device of claim 1, wherein the capacitor absorbs voltage fluctuation caused by switching of the inverter circuit without absorbing voltage fluctuation from the rectifying circuit.

3. The current estimating device of claim 1, wherein the calculation unit further obtains the across voltage of the reactor based on a voltage drop of the reactor.

4. The current estimating device of claim 1, wherein the rectifying circuit is configured as a diode bridge circuit including a plurality of diodes connected in a bridge configuration, and the calculation unit further obtains the across voltage of the reactor based on a voltage drop generated in the diodes.

5. The current estimating device of claim 4, wherein the voltage detection circuit detects voltages correlating with a power source voltage of the AC power source between the AC power source and the rectifying circuit.

6. The current estimating device of claim 1, wherein the voltage detection circuit includes: a first voltage detection unit corresponding to a positive side output of the AC power source; and a second voltage detection unit corresponding to a negative side output of the AC power source, and the calculation unit:

corrects the gains each for one of the first detection result of the first voltage detection unit and of the second detection result of the second voltage detection unit so that the value correlating with the average value per the predetermined time period of the estimated power source current matches the value correlating with the average value per the predetermined time period of the current downstream of the capacitor; and obtains the across voltage of the reactor based on a difference between the first detection result with the gain corrected and the second detection result with the gain corrected.

7. The current estimating device of claim 1, wherein the calculation unit:

calculates, as a first value, a value correlating with an average value per the predetermined time period of an integrated value of the across voltage of the reactor;

calculates, as a second value, a value correlating with an average value per the predetermined time period of a sum of a derivative value of the across voltage of the capacitor and the current downstream of the capacitor; and corrects the gains of the detection results of the voltage detection circuit so that, when the first value matches the second value, the value correlating with the average value per the predetermined time period of the estimated power source current matches the value correlating with the average value per the predetermined time period of the current downstream of the capacitor.

8. The current estimating device of claim 7, wherein the predetermined time period is set to a half period of the AC power source.

9. The current estimating device of claim 1, wherein the calculation unit:
calculates, as a third value, the power source current based the integrated value of the across voltage of the reactor;
calculates, as a fourth value, the power source current based on the derivative value of the across voltage of the capacitor;
corrects offsets of the detection results of the voltage detection circuit so that a phase of the third value matches a phase of the fourth value; and
obtains the across voltage of the reactor based on the detection results, of the voltage detection circuit, with the offsets corrected.

10. The current estimating device of claim 9, wherein the calculation unit:
calculates amplitudes each for one of the third value and the fourth value with predetermined-high frequency waves of a power source frequency,
when the amplitudes are larger than a predetermined value, corrects the offsets of the detection results of the voltage detection circuit; and
when the amplitudes are smaller than the predetermined value, keeps from correcting the offsets of the detection results of the voltage detection circuit.

11. The current estimating device of claim 9, wherein the calculation unit corrects the gains of the detection results of the voltage detection circuit, and then corrects the offsets of the detection results of the voltage detection circuit.

12. The current estimating device of claim 9, wherein the reactor is connected between the AC power source and the rectifying circuit.

13. The current estimating device of claim 1, wherein the calculation unit:
obtains an average value of the detection results in a section, of one period of the AC power source, in which the detection results of the voltage detection circuit are not dominant, and, using the average value, corrects the offsets of the detection results of the voltage detection circuit; and
obtains the across voltage of the reactor based on the detection results, of the voltage detection circuit, with the offsets corrected.

14. The current estimating device of claim 1, wherein the calculation unit:
calculates a power source voltage of the AC power source based on the detection results of the voltage detection circuit;
corrects the offsets of the detection results of the voltage detection circuit, using a voltage value of the power source voltage near a zero cross of the AC power source, and
obtains the across voltage of the reactor based on the detection results, of the voltage detection circuit, with the offsets corrected.

15. A power converter comprising the current estimating device of claim 1.

16. A current estimation method to be used for a power converter and for estimating a power source current which is a current upstream of a capacitor, the power converter including: a rectifying circuit rectifying an AC power output from an AC power source; an inverter circuit supplied with power from the rectifying circuit; the capacitor connected between the rectifying circuit and the inverter circuit in parallel with the rectifying circuit; and a reactor connected between the AC power source and the capacitor, the current estimation method comprising:
detecting, by a voltage divider circuit including a plurality of resistances, voltages correlating with a power source voltage of the AC power source;
first estimating including: obtaining an across voltage of the reactor based on the voltages correlating with the power source voltage of the AC power source; and estimating the power source current based on the across voltage;
correcting gains of the voltages correlating with the detected power source voltage of the AC power source so that a value correlating with an average value per predetermined time period of the estimated power source current matches a value correlating with an average value per the predetermined time period of a current downstream of the capacitor; and
second estimating including: obtaining the across voltage of the reactor based on the voltages, with the gains corrected, correlating with the power source voltage of the AC power source; and estimating the power source current based on the obtained across voltage of the reactor.

* * * * *